United States Patent
Kim et al.

(10) Patent No.: US 12,236,104 B2
(45) Date of Patent: Feb. 25, 2025

(54) OPERATION METHOD OF MEMORY MODULE, OPERATION METHOD OF MEMORY CONTROLLER, AND OPERATION METHOD OF MEMORY SYSTEM

(71) Applicant: SAMSUNG ELECTRONICS CO., LTD., Suwon-si (KR)

(72) Inventors: Dae-Jeong Kim, Seoul (KR); Tae-Kyeong Ko, Hwaseong-si (KR); Nam Hyung Kim, Suwon-si (KR); Do-Han Kim, Hwaseong-si (KR); Deokho Seo, Suwon-si (KR); Ho-Young Lee, Osan-si (KR); Insu Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 150 days.

(21) Appl. No.: 17/889,117

(22) Filed: Aug. 16, 2022

(65) Prior Publication Data
US 2023/0112776 A1   Apr. 13, 2023

(30) Foreign Application Priority Data
Sep. 29, 2021   (KR) .................. 10-2021-0129024

(51) Int. Cl.
*G06F 11/00*   (2006.01)
*G06F 3/06*   (2006.01)
*G06F 11/07*   (2006.01)

(52) U.S. Cl.
CPC .......... *G06F 3/0619* (2013.01); *G06F 3/0659* (2013.01); *G06F 3/0673* (2013.01); *G06F 11/0772* (2013.01)

(58) Field of Classification Search
CPC ............ G06F 11/0772; G06F 11/1076; G06F 11/0766
See application file for complete search history.

(56) References Cited

U.S. PATENT DOCUMENTS

| 5,014,273 A | * | 5/1991 | Gagliardo ........... G06F 11/1056 |
| | | | 714/763 |
| 6,035,436 A | * | 3/2000 | Wu ..................... G06F 11/1064 |
| | | | 714/764 |

(Continued)

FOREIGN PATENT DOCUMENTS

KR   10-1879708 B1   7/2019

OTHER PUBLICATIONS

JEDEC Solid State Technology Association, Committee Letter Ballot, DDR5 Full Spec Draft Rev0.1, Ballot Template version draft rev. 8/11, DDR5 Proposal, Item 1845.31ACommittee JC42.3, dated 2011 (321 Total Pages).

*Primary Examiner* — Philip Guyton
(74) *Attorney, Agent, or Firm* — Sughrue Mion, PLLC

(57) ABSTRACT

An operation method of a memory controller, which is configured to control a memory module including a plurality of memory devices and at least one error correction code (ECC) device, is provided. The method includes reading a data set including user data stored in the plurality of memory devices and ECC data stored in the at least one ECC device, based on a read command and a first address, and writing uncorrectable data in a memory area, which is included in each of the plurality of memory devices and the at least one ECC device and corresponds to the first address, when an error of the user data is not corrected based on the ECC data.

20 Claims, 19 Drawing Sheets

(56) References Cited

U.S. PATENT DOCUMENTS

| | | | |
|---|---|---|---|
| 8,627,140 B2 | 1/2014 | Hattori et al. | |
| 8,661,193 B1* | 2/2014 | Cobos | G11B 20/1889 |
| | | | 711/155 |
| 8,713,350 B2 | 4/2014 | Walton et al. | |
| 8,726,139 B2 | 5/2014 | O'Connor et al. | |
| 8,839,032 B2 | 9/2014 | Walton et al. | |
| 9,766,972 B2 | 9/2017 | Davis et al. | |
| 10,838,790 B2 | 11/2020 | Rangarajan | |
| 11,726,665 B1* | 8/2023 | Sabbag | G06F 3/0652 |
| | | | 711/154 |
| 2003/0218816 A1* | 11/2003 | Katoh | G11B 20/1833 |
| | | | 360/53 |
| 2010/0169739 A1* | 7/2010 | Agarwal | G06F 11/1064 |
| | | | 714/763 |
| 2014/0006904 A1 | 1/2014 | Gendler | |
| 2014/0281747 A1 | 9/2014 | McNairy et al. | |
| 2015/0278016 A1* | 10/2015 | La Fetra | G06F 11/10 |
| | | | 714/766 |
| 2016/0057665 A1 | 2/2016 | Dinan | |
| 2016/0357665 A1* | 12/2016 | Lee | G06F 13/1673 |
| 2019/0042369 A1* | 2/2019 | Deutsch | G06F 3/0673 |
| 2019/0155685 A1* | 5/2019 | Kim | G06F 11/1048 |
| 2019/0227885 A1 | 7/2019 | Mutnury et al. | |
| 2020/0241958 A1 | 7/2020 | Shin | |
| 2022/0179735 A1* | 6/2022 | Brewer | G06F 11/1068 |

\* cited by examiner

FIG. 7A

DSET_UEa

| DQ | Memory Device #0 | | | | Memory Device #1 | | | | ... | Memory Device #15 | | | | ECC Device #0 | | | | ECC Device #1 | | | |
|---|---|---|---|---|---|---|---|---|---|---|---|---|---|---|---|---|---|---|---|---|---|
| | 00 | 01 | 02 | 03 | 04 | 05 | 06 | 07 | ... | 60 | 61 | 62 | 63 | 64 | 65 | 66 | 67 | 68 | 69 | 70 | 71 |
| BL0 | 1 | 1 | 1 | 1 | 1 | 1 | 1 | 1 | ... | 1 | 1 | 1 | 1 | 1 | 1 | 1 | 1 | 1 | 1 | 1 | 1 |
| BL1 | 1 | 1 | 1 | 1 | 1 | 1 | 1 | 1 | ... | 1 | 1 | 1 | 1 | 1 | 1 | 1 | 1 | 1 | 1 | 1 | 1 |
| BL2 | 1 | 1 | 1 | 1 | 1 | 1 | 1 | 1 | ... | 1 | 1 | 1 | 1 | 1 | 1 | 1 | 1 | 1 | 1 | 1 | 1 |
| BL3 | 1 | 1 | 1 | 1 | 1 | 1 | 1 | 1 | ... | 1 | 1 | 1 | 1 | 1 | 1 | 1 | 1 | 1 | 1 | 1 | 1 |

FIG. 7B

DSET_UEb

| DQ | Memory Device #0 | | | | Memory Device #1 | | | | ... | Memory Device #15 | | | | ECC Device #0 | | | | ECC Device #1 | | | |
|---|---|---|---|---|---|---|---|---|---|---|---|---|---|---|---|---|---|---|---|---|---|
| | 00 | 01 | 02 | 03 | 04 | 05 | 06 | 07 | ... | 60 | 61 | 62 | 63 | 64 | 65 | 66 | 67 | 68 | 69 | 70 | 71 |
| BL0 | 1 | 1 | 1 | 1 | 1 | 1 | 1 | 1 | ... | 1 | 1 | 1 | 1 | 1 | 1 | 1 | 1 | 1 | 1 | 1 | 1 |
| BL1 | 0 | 0 | 0 | 0 | 0 | 0 | 0 | 0 | ... | 0 | 0 | 0 | 0 | 0 | 0 | 0 | 0 | 0 | 0 | 0 | 0 |
| BL2 | 1 | 1 | 1 | 1 | 1 | 1 | 1 | 1 | ... | 1 | 1 | 1 | 1 | 1 | 1 | 1 | 1 | 1 | 1 | 1 | 1 |
| BL3 | 0 | 0 | 0 | 0 | 0 | 0 | 0 | 0 | ... | 0 | 0 | 0 | 0 | 0 | 0 | 0 | 0 | 0 | 0 | 0 | 0 |

OPERATION METHOD OF MEMORY MODULE, OPERATION METHOD OF MEMORY CONTROLLER, AND OPERATION METHOD OF MEMORY SYSTEM

CROSS-REFERENCE TO RELATED APPLICATIONS

This application claims priority under 35 U.S.C. § 119 to Korean Patent Application No. 10-2021-0129024 filed on Sep. 29, 2021, in the Korean Intellectual Property Office, the disclosure of which is incorporated by reference herein in its entirety.

BACKGROUND

Embodiments of the present disclosure relate to a semiconductor memory, and more particularly, to an operation method of a memory module, an operation method of a memory controller, and an operation method of a memory system.

A semiconductor memory device is classified as a volatile memory device, in which stored data disappear when a power supply is turned off, such as a static random access memory (SRAM) or a dynamic random access memory (DRAM), or a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM).

In a computer system, the DRAM is used as a system memory. A central processing unit (CPU) provides an error correction function for correcting an error of data read from the DRAM. The CPU may correct an error of data read from the DRAM by using the error correction function. In the case where the error of the data is not corrected by the error correction function, the CPU may perform an error recovery operation such as system rebooting. However, according to a specific operation (e.g., read-modify-write) of the CPU, because the CPU is capable of normally operating even though the error of the read data is not corrected, a separate recovery operation may not be required. In this case, a separate means for managing information indicating that an uncorrectable error is included in data is required.

SUMMARY

Embodiments of the present disclosure provide an operation method of a memory controller with improved reliability, an operation method of a memory module, and an operation method of a memory system.

According to an embodiment, an operation method of a memory controller which is configured to control a memory module including a plurality of memory devices and at least one error correction code (ECC) device includes reading a data set including user data stored in the plurality of memory devices and ECC data stored in the at least one ECC device, based on a read command and a first address, and writing uncorrectable data in a memory area, which is included in each of the plurality of memory devices and the at least one ECC device and corresponds to the first address, when an error of the user data is not corrected based on the ECC data.

According to an embodiment, an operation method of a memory module which includes a plurality of memory devices and at least one error correction code (ECC) device includes receiving a read command and a first address from a memory controller, sending a data set including user data stored in the plurality of memory devices and ECC data stored in the at least one ECC device to the memory controller, based on the read command and the first address, and writing uncorrectable data in each of the plurality of memory devices and the at least one ECC device under control of the memory controller when an error of the user data is not corrected by the memory controller based on the ECC data.

According to an embodiment, an operation method of a memory system which includes a memory controller and a memory module including a plurality of memory devices and at least one error correction code (ECC) device includes reading, by the memory controller, a data set from the memory module, correcting, by the memory controller, an error of the data set, sending, by the memory controller, an uncorrectable command to the memory module, when the error of the data set is not corrected, and writing, by the memory module, uncorrectable data in each of the plurality of memory devices and the at least one ECC device in response to the uncorrectable command. An uncorrectable data set including the uncorrectable data stored in each of the plurality of memory devices and the at least one ECC device includes an error uncorrectable by an error correction operation of the memory controller.

According to an embodiment, a memory device includes a memory cell array that includes a plurality of memory cells, a sense amplifier and write driver that reads first data from the plurality of memory cells of the memory cell array or writes second data in the plurality of memory cells of the memory cell array, and an uncorrectable data generator that generates uncorrectable data in response to a write command and an alert signal from an external memory controller. The uncorrectable data are written in the plurality of memory cells by the sense amplifier and write driver, and the alert signal is maintained at a low level by the external memory controller while the write command is received.

BRIEF DESCRIPTION OF THE FIGURES

The above and other aspects of the present disclosure will become apparent by describing in detail embodiments thereof with reference to the accompanying drawings: in which:

FIGS. 7A and 7B are diagrams illustrating embodiments of an uncorrectable data set;

DETAILED DESCRIPTION

Below, embodiments of the present disclosure are described in detail with reference to the drawings.

Figure 1:
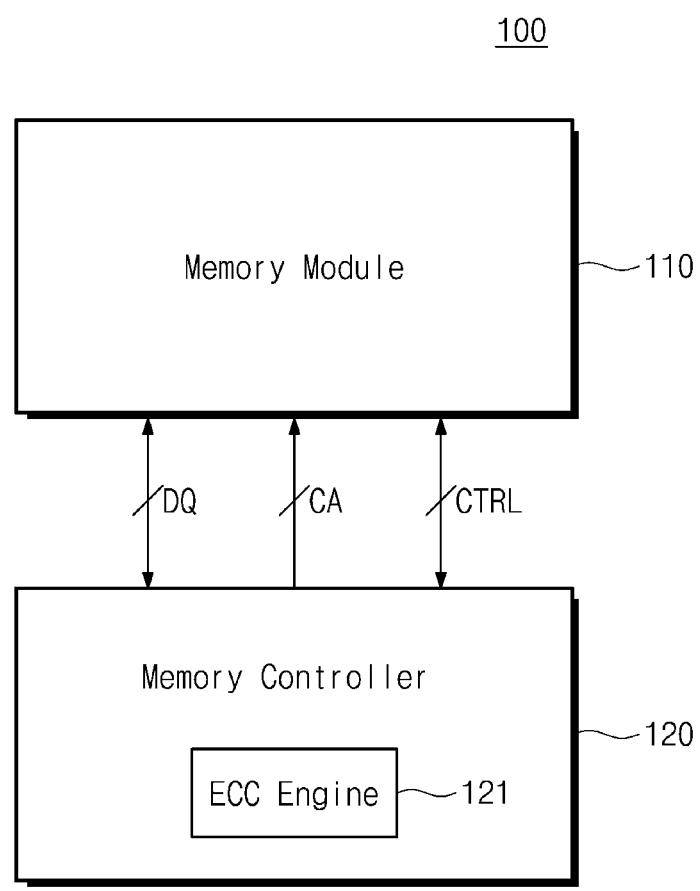
FIG. 1 is a block diagram illustrating a memory system according to an embodiment of the present disclosure.

FIG. 1 is a block diagram illustrating a memory system according to an embodiment of the present disclosure. Referring to FIG. 1, a memory system 100 may include a memory module 110 and a memory controller 120. In an embodiment, the memory system 100 may be one of information processing devices, which are configured to process a variety of information and to store the processed information, such as a personal computer (PC), a laptop, a server, a workstation, a smartphone, a tablet PC, a digital camera, and a black box.

The memory module 110 may be configured to store data or output the stored data, under control of the memory module 110. For example, the memory module 110 may be configured to receive a command signal through command/address lines CA from the memory controller 120, to receive a control signal CTRL through a separate line from the memory controller 120, and to output a data signal through data lines DQ in response to the received signals or store a received data signal in response to the received signals.

In an embodiment, the memory module 110 may include a plurality of memory devices. The memory module 110 may have a structure of a dual in-line memory module (DIMM). Below, to describe embodiment of the present disclosure easily, it is assumed that the memory module 110 is a registered DIMM (RDIMM) supporting an ECC function. However, the present disclosure is not limited thereto. For example, the memory module 110 or the dual in-line memory module may be implemented in various structures, such as an unbuffered DIMM (UDIMM), a registered DIMM (RDIMM), a load reduced DIMM (LRDIMM), a nonvolatile DIMM (NVDIMM), and a small outline DIMM (SODIMM), depending on an implementation manner.

The memory controller 120 may be configured to control the memory module 110 by using various signals. For example, the memory controller 120 may send a command and an address signal to the memory module 110 through the command/address lines CA and may send the control signal CTRL to the memory module 110 through separate lines. The memory controller 120 may control a write operation and a read operation of the memory module 110 by using various signals. In the read operation of the memory module 110, the memory controller 120 may receive a data signal through the data lines DQ from the memory module 110; in the write operation of the memory module 110, the memory controller 120 may send a data signal to the memory module 110 through the data lines DQ.

In an embodiment, the memory module 110 and the memory controller 120 may communicate with each other through a given interface. The given interface may be a double data rate (DDR) interface, but embodiments of the present disclosure are not limited thereto.

The memory controller 120 may include an error correction code (ECC) engine 121. The ECC engine 121 may generate ECC data for write data to be stored in the memory module 110. The generated ECC data may be stored in the memory module 110 together with the write data. Afterwards, when data are read from the memory module 110, the ECC engine 121 may detect and correct an error of the read data by using the ECC data corresponding to the read data.

In an embodiment, in the case where an error included in specific data exceeds an error correction capability range of the ECC engine 121, the error included in the specific data may not be corrected. In this case, the memory controller 120 may write, in the memory module 110, information (e.g., a poison bit) indicating that an uncorrectable error is included in the specific data. In an embodiment, at least one bit of a data set corresponding to the specific data may be allocated for the poison bit. In this case, because at least one bit is allocated for a poison bit (in other words, because at least one bit is incapable of being used for specific data or ECC data), a unit size of a data set may decrease, or the error correction capability may decrease.

According to an embodiment of the present disclosure, in the case where an uncorrectable error is included in specific data, instead of writing the poison bit, a data set (i.e., including both the specific data and a corresponding ECC code) corresponding to the specific data may be written as a specific data set. In this case, because it is unnecessary to allocate a bit for the poison bit, the decrease in the unit size of the data set and the decrease of the error correction capability may be prevented. A configuration according to an embodiment of the present disclosure will be described in detail with reference to accompanying drawings.

Figure 2:
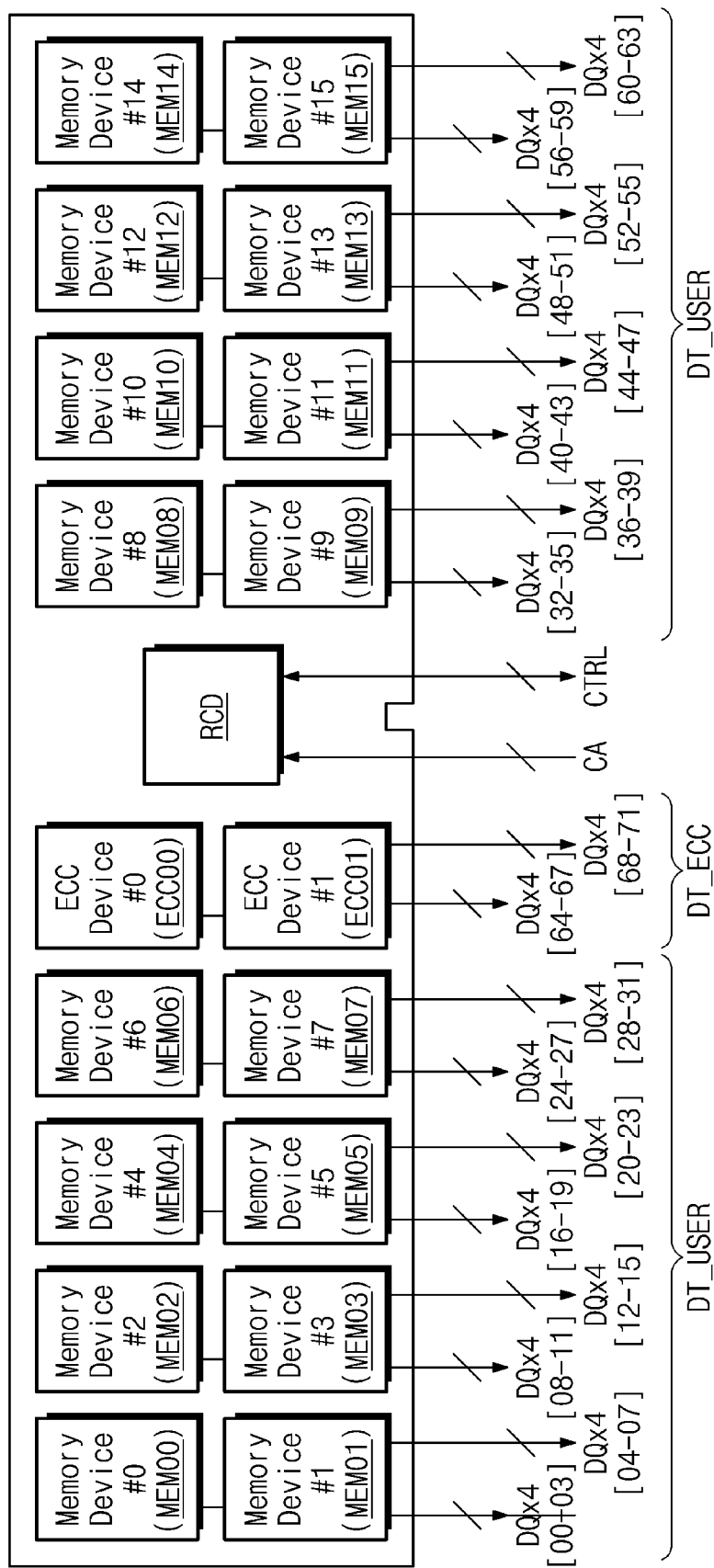
FIG. 2 is a block diagram illustrating a memory module of FIG. 1.
Figure 3:
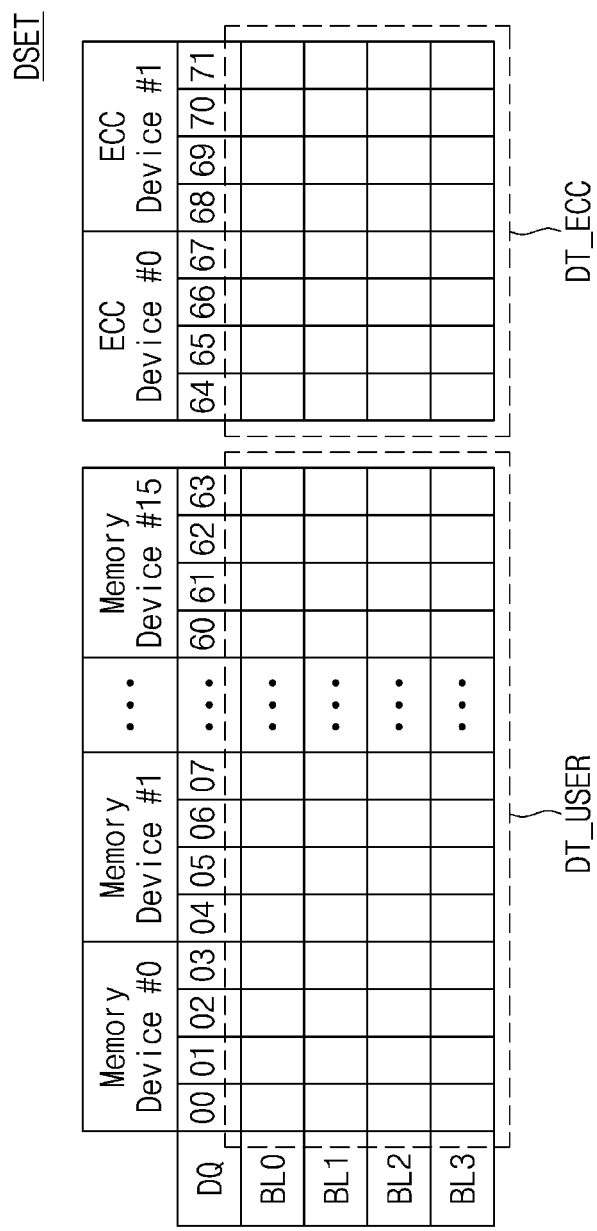
FIG. 3 is a diagram for describing a data set stored in a memory module of FIG. 2.

FIG. 2 is a block diagram illustrating a memory module of FIG. 1. FIG. 3 is a diagram for describing a data set stored in a memory module of FIG. 2. To describe embodiment of the present disclosure easily, it is assumed that the memory module 110 has a structure of the RDIMM. However, the present disclosure is not limited thereto. For example, the memory module 110 may be implemented in various DIMM structures or various other structures.

Referring to FIGS. 1 to 3, the memory module 110 may include a register clock driver RCD, a plurality of memory devices MEM00 to MEM15, and a plurality of ECC devices ECC00 and ECC01. In an embodiment, each of the plurality of memory devices MEM00 to MEM15 and the plurality of ECC devices ECC00 and ECC01 may be a dynamic random access memory (DRAM) device, but the present disclosure is not limited thereto.

The register clock driver RCD may receive a command and an address signal through the command/address lines CA from the memory controller 120. The register clock driver RCD may transfer the received signals to the plurality of memory devices MEM00 to MEM15 and the plurality of ECC devices ECC00 and ECC01.

Each of the plurality of memory devices MEM00 to MEM15 and the plurality of ECC devices ECC00 and ECC01 may operate in response to a signal provided from the register clock driver RCD. For example, in response to the signal provided from the register clock driver RCD, each of the plurality of memory devices MEM00 to MEM15 and the plurality of ECC devices ECC00 and ECC01 may send data to the memory controller 120 through data lines DQx4 or may receive data from the memory controller 120 through the data lines DQx4.

The memory controller 120 may write or read data in or from the memory module 110 in units of data set DSET. In an embodiment, as illustrated in FIG. 3, the data set DSET may include user data DT_USER and ECC data DT_ECC. As illustrated in FIG. 3, in the case where each of the plurality of memory devices MEM00 to MEM15 and the plurality of ECC devices ECC00 and ECC01 is set to a burst length of 4, that is, BL4, 4 data bits may be transmitted/received through one data line. Because each of the plurality of memory devices MEM00 to MEM15 and the plurality of ECC devices ECC00 and ECC01 is connected with 4 data lines DQx4, the user data DT_USER may have a size of 256 bits (=64×4), and the ECC data DT_ECC may have a size of 32 bits (=8×4).

In an embodiment, the size or unit of the data set DSET may be variously changed under control of the memory controller 120 (e.g., through a burst length control) or depending the number of data lines connected with each device. In an embodiment, the data set DSET may correspond to a size of a cache line that is used in a host device (e.g., a CPU or an application processor (AP)) in which the memory controller 120 is included.

In an embodiment, the plurality of memory devices MEM00 to MEM15 may be configured to store the user data DT_USER, and the plurality of ECC devices ECC00 and ECC01 may store the ECC data DT_ECC corresponding to the user data DT_USER.

For example, the memory controller 120 may exchange the data set DSET with the memory module 110 through 72 data lines 00 to 71. In this case, the memory controller 120 may exchange the user data DT_USER with the plurality of memory devices MEM00 to MEM15 through the 0th to 63rd data lines 00 to 63 of the 72 data lines 00 to 71, and may exchange the ECC data DT_ECC with the plurality of ECC devices ECC00 and ECC01 through the 64th to 71st data lines 64 to 71 thereof.

In an embodiment, various numerical values described with reference to FIGS. 2 and 3, such as the number of memory devices, the number of ECC devices, the number of data lines connected with each device, the size of user data, the size of ECC data, and the size of a data set, are for describing an embodiment of the present disclosure easily, and the present disclosure is not limited thereto. It may be understood that the above numerical values may be variously changed or modified depending on an implementation manner.

Figure 4:
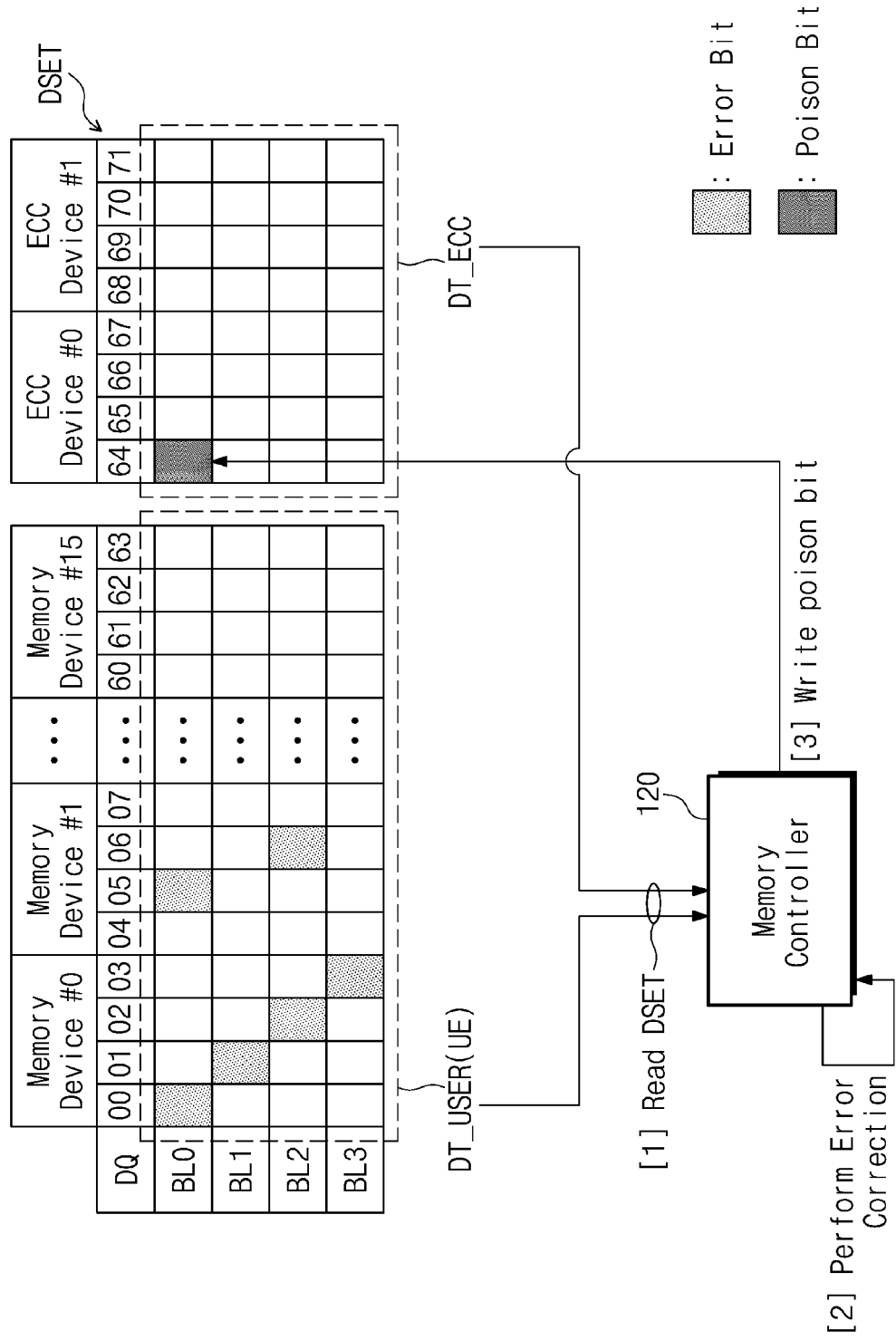
FIG. 4 is a diagram for describing an operation of writing a poison bit in a memory module.

FIG. 4 is a diagram for describing an operation of writing a poison bit in a memory module. Below, to describe embodiments of the present disclosure easily, a configuration in which the memory module 110 performs a specific operation (e.g., an operation of writing a poison bit or an uncorrectable data set) on the memory module 110 when the data set DSET read from the memory module 110 includes an uncorrectable error UE will be described. However, the present disclosure is not limited thereto. For example, in the case where the data set DSET read from the memory module 110 includes the uncorrectable error UE, the memory controller 120 may be configured to perform a recovery operation such as system rebooting.

In contrast, in the case where the memory controller 120 performs a specific operation (e.g., read-memory-write) under control of a host (e.g., a CPU), even though an uncorrectable error is included in the data set DSET, a separate recovery operation may not be required because a modify and write operation is performed on the data set DSET later. Under the above operation condition, the memory controller 120 may be configured to perform an operation according to an embodiment of the present disclosure to be described below.

Referring to FIGS. 2 to 4, the memory controller 120 may read the data set DSET from the memory module 110 (operation [1] in FIG. 4). The data set DSET may include the user data DT_USER read from the plurality of memory devices MEM00 to MEM15 and the ECC data DT_ECC read from the plurality of ECC devices ECC00 and ECC01.

The memory controller 120 may perform an error correction operation (operation [2] in FIG. 4). For example, the ECC engine 121 of the memory controller 120 may generate an ECC code based on the user data DT_USER included in the data set DSET and may compare the generated ECC code with the ECC data DT_ECC included in the data set DSET or a portion of the ECC data DT_ECC. When the ECC code and the ECC data DT_ECC are different, the ECC engine 121 of the memory controller 120 may correct an error of the user data DT_USER by using the ECC data DT_ECC or the portion of the ECC data DT_ECC. In an embodiment, when the error of the user data DT_USER exceeds the error correction capability range of the ECC engine 121 (e.g., when a multi-chip error occurs as illustrated in FIG. 4), the ECC engine 121 fails to correct the error of the user data DT_USER. That is, when the user data DT_USER include the uncorrectable error UE, the error of the user data DT_USER may not be corrected by the ECC engine 121.

In this case, the memory controller 120 may write the poison bit in the memory module 110 (operation [3] in FIG. 4). For example, when the user data DT_USER include the uncorrectable error UE, the memory controller 120 may write the poison bit at a specific bit of the ECC data DT_ECC. In the embodiment of FIG. 4, the poison bit may be written at a bit corresponding to the 0-th burst length BL0 of the 64th data line DQ64 of the 0-th ECC device ECC00.

As described above, when the uncorrectable error UE is included in the user data DT_USER, the memory controller 120 may write the poison bit at a specific position or a specific bit of the data set DSET. Afterwards, when the memory controller 120 reads the same data set DSET from the memory module 110, the memory controller 120 may recognize that the uncorrectable error UE is included in the data set DSET, by checking the poison bit of the data set DSET. Alternatively, as the poison bit of the data set DSET is set, the error of the data set DSET may not be corrected.

In an embodiment, the ECC engine 121 of the memory controller 120 may detect an error of the user data DT_USER by using a CRC-16 polynomial. In this case, 16 bits read from the 0-th ECC device ECC00 from among bits of the ECC data DT_ECC corresponding to the user data DT_USER may be used as a code for a CRC-16 technique. That is, the code for the CRC-16 technique may be implemented with 65,536 (=$2^{16}$) code combinations. In contrast, when one of the 16 bits read from the 0-th ECC device ECC00 from among the bits of the ECC data DT_ECC corresponds to the poison bit set by the memory controller 120, the remaining 15 bits other than the poison bit may be used for the CRC-16 technique. In this case, the code for the CRC-16 technique may be implemented with 32,768 (=$2^{(16-1)}$) code combinations. That is, in the case where one of the bits of the ECC data DT_ECC is used as the poison bit, the number of code combinations for the CRC-16 technique may decrease, thereby causing the reduction of the error correction capability of the ECC engine 121.

Alternatively, the memory controller 120 may allocate or use a specific position or a specific bit of the user data DT_USER as the poison bit. In this case, because the size of the ECC data DT_ECC is maintained, the reduction of the error correction capability of the ECC engine 121 may be prevented. In contrast, because a specific bit of the user data DT_USER is used as the poison bit, the unit size of the user data DT_USER may decrease.

As described above, in the case where an uncorrectable error is included in the user data DT_USER, the memory controller 120 may write the poison bit at a specific position or a specific bit of the data set DSET. However, this causes the decrease in the capacity of the user data DT_USER or the reduction of the error correction capability of the ECC engine 121.

Figure 5:
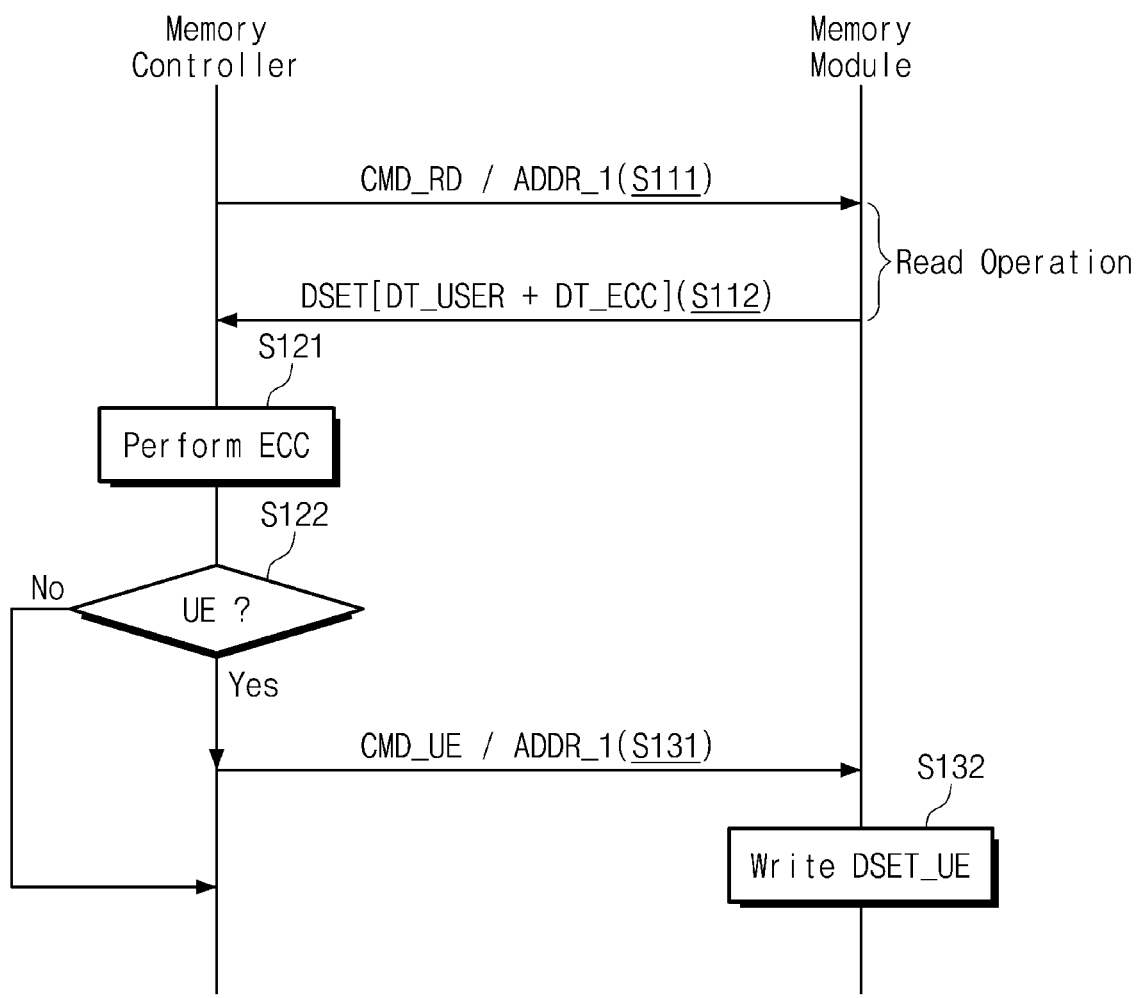
FIG. 5 is a flowchart illustrating an operation of a memory system of FIG. 1.

FIG. 5 is a flowchart illustrating an operation of a memory system of FIG. 1. Operations of the memory module 110 and the memory controller 120 according to an embodiment of the present disclosure will be described in detail with reference to the following drawings. Referring to FIGS. 1, 2, 3, and 5, in operation S111, the memory controller 120 may send a read command CMD_RD and a first address ADDR_1 to the memory module 110. In an embodiment, the read command CMD_RD and the first address ADDR_1 may comply with the interface protocol defined between the memory module 110 and the memory controller 120.

The memory module 110 may perform a read operation on a memory area corresponding to the first address ADDR_1 in response to the read command CMD_RD and the first address ADDR_1 from the memory controller 120. For example, each of the plurality of memory devices MEM00 to MEM15 and the plurality of ECC devices ECC00 and ECC01 of the memory module 110 may read data stored in the area corresponding to the first address ADDR_1. The data read from the plurality of memory devices MEM00 to MEM15 may be the user data DT_USER, and the data read from the plurality of ECC devices ECC00 and ECC01 may be the ECC data DT_ECC.

In operation S112, the memory module 110 may send the data set DSET to the memory controller 120. In an embodiment, the data set DSET may include the user data DT_USER read from the plurality of memory devices MEM00 to MEM15 and the ECC data DT_ECC read from the plurality of ECC devices ECC00 and ECC01.

In operation S113, the memory controller 120 may perform the ECC operation (i.e., error correction operation). For example, the ECC engine 121 of the memory controller 120 may perform the ECC operation based on the user data DT_USER and the ECC data DT_ECC included in the data set DSET. The ECC operation is described with reference to FIG. 4, and thus, additional description will be omitted to avoid redundancy.

In operation S122, the memory controller 120 may determine whether the uncorrectable error UE is included in the user data DT_USER, as a result of the ECC operation. When the uncorrectable error UE is not included in the user data DT_USER (i.e., when an error of the user data DT_USER is corrected), the memory controller 120 may not perform a separate operation for error processing of the user data DT_USER.

When the uncorrectable error UE is included in the user data DT_USER (i.e., when an error of the user data DT_USER is not corrected), in operation S131, the memory controller 120 may send an uncorrectable error command CMD_UE (for convenience of description, hereinafter referred to as an "UE command") and the first address ADDR_1 to the memory module 110.

In operation S132, the memory module 110 may write the uncorrectable data set DSET_UE in the memory area corresponding to the first address ADDR_1 in response to the UE command CMD_UE and the first address ADDR_1.

In an embodiment, the UE command CMD_UE may be a command for writing the uncorrectable data set DSET_UE in the memory module 110. The UE command CMD_UE may be a command or a combination of commands defined in advance between the memory module 110 and the memory controller 120. Alternatively, the UE command CMD_UE may be a combination of commands or control signals complying with the interface protocol defined in advance between the memory module 110 and the memory controller 120 or may be a reserved command or a vendor command.

In an embodiment, the uncorrectable data set DSET_UE may be a set of data having a given pattern. In an embodiment, the given pattern may include all one bit vector, all zero bit vector, or a bit vector of various combinations. In an embodiment, in the case where the ECC engine 121 performs the ECC operation on the uncorrectable data set DSET_UE, the ECC engine 121 may determine that the uncorrectable error UE is included therein. That is, the uncorrectable data set DSET_UE may include data patterns or bit vectors intentionally designated to include an error uncorrectable by the ECC engine 121.

As described above, in the case where the uncorrectable error UE is included in the data set DSET read from the memory module 110, the memory controller 120 may write the uncorrectable data set DSET_UE in a first memory area in which the read data set DSET are present. Afterwards, in the case where the memory controller 120 performs the read operation on the first memory area, a data set read through the read operation may be determined as the uncorrectable error UE is included therein, and thus, the memory controller 120 may recognize that the data set present in the first memory area includes the uncorrectable error UE. That is, the memory controller 120 may recognize that an uncorrectable error occurs previously, without writing a separate poison bit in the memory module 110. Also, because a separate poison bit is not allocated to the memory module 110, the error correction capability of the ECC engine 121 may not be reduced, and the capacity of the user data DT_USER may not decrease.

In an embodiment, the memory controller 120 may not provide a separate data signal through the data lines DQ for the purpose of writing the uncorrectable data set DSET_UE in the memory module 110. That is, the uncorrectable data set DSET_UE may be automatically generated by the memory module 110, not directly provided from the memory controller 120.

For example, the memory module 110 may be configured to automatically generate a pattern or unit data corresponding to the uncorrectable data set DSET_UE in response to the UE command CMD_UE. In an embodiment, each of the plurality of memory devices MEM00 to MEM15 and the plurality of ECC devices ECC00 and ECC01 included in the memory module 110 may include an uncorrectable data generator configured to generate a pattern corresponding to the uncorrectable data set DSET_UE. A configuration of each of the plurality of memory devices MEM00 to MEM15 and the plurality of ECC devices ECC00 and ECC01 included in the memory module 110 will be described in detail with reference to FIG. 8.

Figure 6:
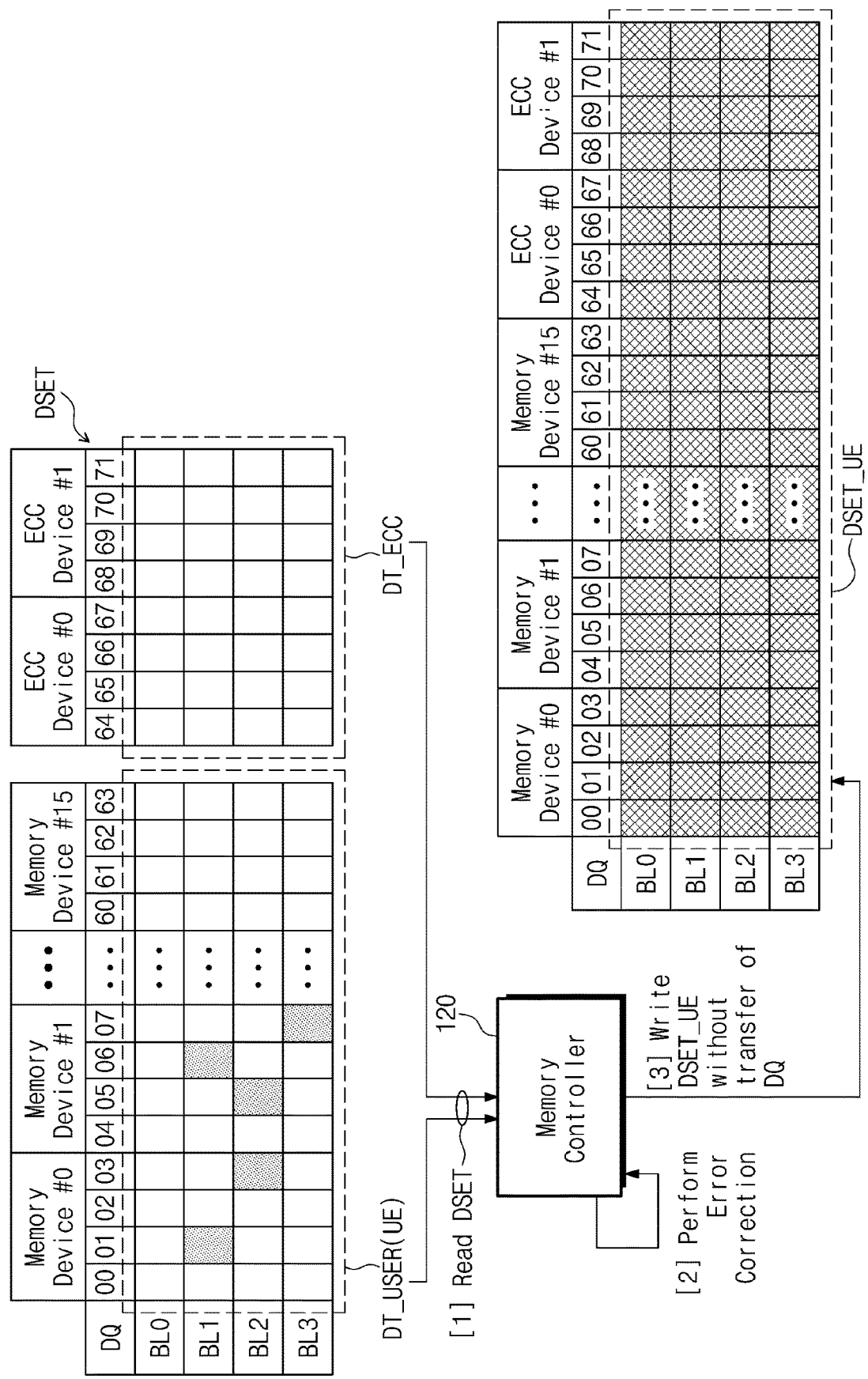
FIG. 6 is a diagram for describing an operation according to the flowchart of FIG. 5.

FIG. 6 is a diagram for describing an operation according to the flowchart of FIG. 5. Referring to FIGS. 1, 5, and 6, the memory controller 120 may read the data set DSET including the user data DT_USER and the ECC data DT_ECC from the memory module 110 (operation [1] in FIG. 6). The structure of the data set DSET is described above, and thus, additional description will be omitted to avoid redundancy.

The memory controller 120 may perform the error correction operation (i.e., ECC operation) based on the user data DT_USER and the ECC data DT_ECC included in the data set DSET. The ECC operation is described above, and thus, additional description will be omitted to avoid redundancy.

When a result of the ECC operation indicates that the user data DT_USER includes the uncorrectable error UE (i.e., when an error of the user data DT_USER is not corrected), the memory controller 120 may write the uncorrectable data set DSET_UE in the same memory area in which the data set DSET is present (operation [3] in FIG. 6). In this case, the memory module 110 may write the uncorrectable data set DSET_UE in the memory area in which the data set DSET is stored, under control of the memory controller 120.

In an embodiment, the writing of the uncorrectable data set DSET_UE may be performed without a transfer of a data signal from the memory controller 120 to the memory module 110. Alternatively, the writing of the uncorrectable data set DSET_UE may be performed regardless of a transfer of a data signal from the memory controller 120 to the memory module 110.

Unlike the embodiment of FIG. 4, in the embodiment of FIG. 6, the poison bit is not set to the data set DSET. That is, all the bits transmitted/received to/from the plurality of memory devices MEM00 to MEM15 may be used as the user data DT_USER, and all the bits transmitted/received to/from the plurality of ECC devices ECC00 and ECC01 may be used as the ECC data DT_ECC. Accordingly, the decrease in the capacity of user data and the reduction of the error correction capability of the ECC engine 121 may be reduced.

In an embodiment, in the case where the uncorrectable error UE is included in the data set DSET, the uncorrectable data set DSET_UE may be written in the same memory area in which the data set DSET is stored. As such, afterwards, the memory controller 120 may read the uncorrectable data set DSET_UE from the same memory area and may recognize that the uncorrectable error UE exists. In an embodiment, in the case where the uncorrectable data set DSET_UE is read, the memory controller 120 may perform the follow-up operation (e.g., system rebooting) for error recovery.

FIGS. 7A and 7B are diagrams illustrating embodiments of an uncorrectable data set. In an embodiment, the uncorrectable data set DSET_UE may have a data pattern intentionally set such that an error uncorrectable by the ECC engine 121 of the memory controller 120 is included.

First, as illustrated in FIG. 7A, first uncorrectable data set DSET_UEa may be a data set in which all bits have a value of "1" (i.e., all one bit vector). That is, both the user data DT_USER stored in the plurality of memory devices MEM00 to MEM15 and the ECC data DT_ECC stored in the plurality of ECC devices ECC00 and ECC01 may have a bit value of "1".

Alternatively, as illustrated in FIG. 7B, second uncorrectable data set DSET_UEb may be a data set in which some bits have a value of "1" and the remaining bits have a value of "0". For example, in the second uncorrectable data set DSET_UEb output from the memory module 110, bits corresponding to the 0-th burst BL0 (i.e., bits firstly output from the memory module 110 through the data lines DQ) may have a value of "1", bits corresponding to the first burst BL1 (i.e., bits secondly output from the memory module 110 through the data lines DQ) may have a value of "0", bits corresponding to the second burst BL2 (i.e., bits thirdly output from the memory module 110 through the data lines DQ) may have a value of "1", and bits corresponding to the third burst BL3 (i.e., bits fourthly output from the memory module 110 through the data lines DQ) may have a value of "0". That is, the second uncorrectable data set DSET_UEb may be a data set that is set such that bits output at a specific point in time from each of the plurality of memory devices MEM00 to MEM15 and the plurality of ECC devices ECC00 and ECC01 have a value of "1".

In the case where the ECC operation is performed by the ECC engine 121 based on the first and second uncorrectable data sets DSET_UEa and DSET_UEb described with reference to FIGS. 7A and 7B, a result of the ECC operation may indicate that the uncorrectable error UE is included. The determination of the uncorrectable error UE, which is performed by the ECC engine 121, may be implemented without changing the operation of the ECC engine 121.

As described above, in the case where the uncorrectable error UE is included in the data set DSET read from the memory module 110, the memory controller 120 may write the uncorrectable data set DSET_UE in the memory module 110, thus causing a fail of (i.e., uncorrectable error detection in) the ECC operation by the ECC engine 121 in the read operation to be performed later on.

The uncorrectable data sets DSET_UEa and DSET_UEb described with reference to FIGS. 7A and 7B are some examples, and the present disclosure is not limited thereto. The uncorrectable data set DSET_UEa and DSET_UEb may be implemented with various forms of data patterns that are uncorrectable by the ECC engine 121.

In an embodiment, the uncorrectable data set DSET_UE according to the present disclosure may be distinguished from a data pattern that is written in memory devices or ECC devices for various purposes. For example, as described with reference to FIG. 4, to provide notification that a data set includes an uncorrectable error, the memory controller 120 may use the poison bit. Alternatively, to provide notification that a data set includes an uncorrectable error, the memory controller 120 may write the ECC data DT_ECC of a specific pattern in the plurality of ECC devices ECC00 and ECC01. Alternatively, to provide notification that a data set includes an uncorrectable error, the memory controller 120 may write the user data DT_USER of a specific pattern in the plurality of memory devices MEM00 to MEM15. The technique in use by the memory controller 120 may be signaled to the memory module 110 using a mode command.

However, as described above, in the case of writing one of the user data DT_USER and the ECC data DT_ECC in the form of a specific pattern, the specific pattern may cause the decrease in the capacity of the user data DT_USER and the reduction of the error correction capability of the ECC engine 121. For example, in the case where the user data DT_USER are written in the form of a specific pattern, because one code corresponding to the specific pattern is used as a value indicating an uncorrectable error, the number of codes expressed by the user data DT_USER decreases from $4,294,967,296$ $(=2^{32})$ to $4,294,967,295$ $(=2^{32}-1)$, thereby causing the decrease in the capacity of the user data DT_USER. Alternatively, in the case where the ECC data DT_ECC are written in the form of a specific pattern, because one code corresponding to the specific pattern is used as a value indicating an uncorrectable error, the number of codes expressed by the ECC data DT_ECC (e.g., the number of codes for CRC-16) decreases from $65,536$ $(=2^{16})$ to $65,535$ $(=2^{16}-1)$, thereby causing the reduction of the error correction capability of the ECC engine 121.

In contrast, the uncorrectable data set DSET_UE according to the present disclosure may be written in both the plurality of memory devices MEM00 to MEM15 and the plurality of ECC devices ECC00 and ECC01. That is, as the same pattern is written in both the plurality of memory devices MEM00 to MEM15 and the plurality of ECC devices ECC00 and ECC01, the detection of the uncorrectable error UE by the ECC engine 121 is intended. That is, because there is not a need to allocate a specific code providing notification that the uncorrectable error UE exists, the decrease in the capacity of the user data DT_USER and the reduction of the error correction capability of the ECC engine 121 do not occur.

In an embodiment, the memory module 110 according to an embodiment of the present disclosure may generate and write the uncorrectable data set DSET_UE without receiving a separate data signal through the data line DQ from the memory controller 120 or regardless of a signal of the data line DQ.

Below, how to generate and write the uncorrectable data set DSET_UE based on one of the plurality of memory devices MEM00 to MEM15 included in the memory module 110 will be described.

Figure 8:
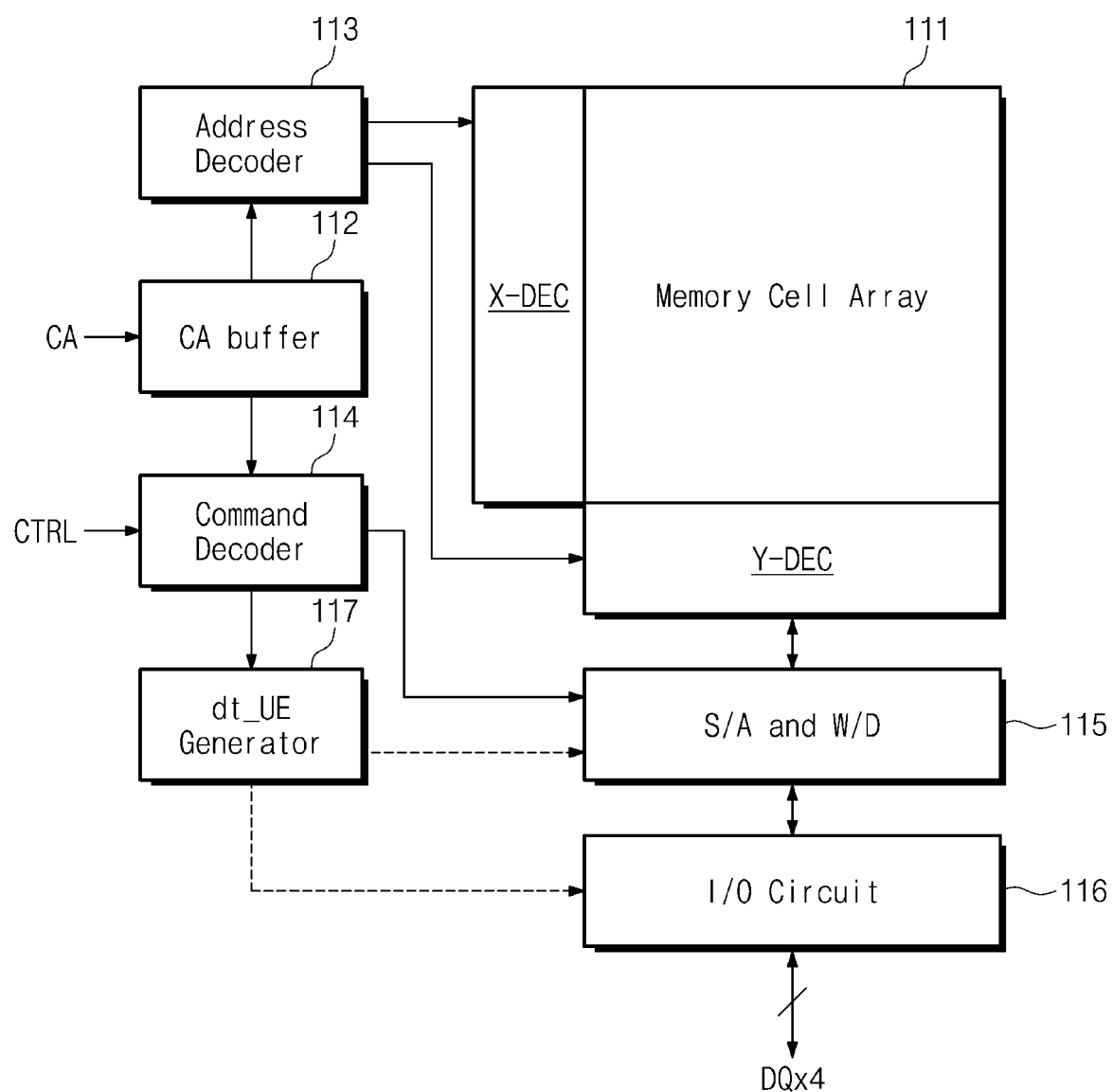
FIG. 8 is a block diagram illustrating one memory device included in a memory module of FIG. 2.

FIG. 8 is a block diagram illustrating one memory device included in a memory module of FIG. 2. A structure of the first memory device MEM01 will be described with reference to FIG. 8, but the present disclosure is not limited thereto. The remaining memory devices MEM00 and MEM02 to MEM15 or the ECC devices ECC00 and ECC01 may be similar in structure to the first memory device MEM01 of FIG. 8.

Referring to FIGS. 2 and 8, the first memory device MEM01 may include a memory cell array 111, an X-decoder X-DEC, a Y-decoder Y-DEC, a command/address buffer 112, an address decoder 113, a command decoder 114, a sense amplifier and write driver 115, an input/output circuit 116, and an uncorrectable data generator 117.

The memory cell array 111 may include a plurality of memory cells. The plurality of memory cells may be connected with word lines and bit lines. In an embodiment, each of the plurality of memory cells may be a DRAM cell, but the present disclosure is not limited thereto. For example, each of the plurality of memory cells may be implemented with one of various types of memory cells such as a PRAM cell, an MRAM cell, an RRAM cell, an FRAM cell, and a TRAM cell.

The X-decoder X-DEC may be connected with the word lines and may control the word lines under control of the address decoder 113. The Y-decoder Y-DEC may be connected with the bit lines and may control the bit lines under control of the address decoder 113.

The command/address buffer 112 may be configured to receive command and address signals from the memory controller 120 (or the register clock driver RCD) through the command/address lines CA and to temporarily store or buffer the received signals.

The address decoder 113 may decode the address signal stored in the command/address buffer 112 and may control the X-decoder X-DEC and the Y-decoder Y-DEC based on a decoding result.

The command decoder 114 may decode the command signal stored in the command/address buffer 112 and may control the components of the first memory device MEM01. For example, in the case where the command signal stored in the command/address buffer 112 corresponds to a write command (i.e., in the case where a command received from the memory controller 120 is the write command), the command decoder 114 may control an operation of the sense amplifier and write driver 115 (i.e., may activate the write driver) such that data received through the data lines DQ and the input/output circuit 116 are written in the memory cell array 111. Alternatively, in the case where the command signal stored in the command/address buffer 112 corresponds to a read command (i.e., in the case where the command received from the memory controller 120 is the read command), the command decoder 114 may control an operation of the sense amplifier and write driver 115 (i.e., may activate the sense amplifier) such that data stored in the memory cell array 111 are read out.

Under control of the command decoder 114, the sense amplifier and write driver 115 may read data stored in the memory cell array 111 or may write data in the memory cell array 111.

The input/output circuit 116 may receive data from the memory controller 120 through the data lines DQ or may send data to the memory controller 120 through the data lines DQ.

The uncorrectable data generator 117 may receive uncorrectable data dt_UE under control of the command decoder 114. For example, as described with reference to FIGS. 5 to 7B, in the case where the data set DSET read from the memory module 110 includes the uncorrectable error UE, the memory controller 120 may send the UE command CMD_UE to the memory module 110. The memory module 110 may write the uncorrectable data set DSET_UE in the corresponding memory area (or memory cells) in response to the UE command CMD_UE.

In an embodiment, the uncorrectable data set DSET_UE may include the uncorrectable data dt_UE stored in each of the plurality of memory devices MEM00 to MEM15 and the plurality of ECC devices ECC00 and ECC01. In other words, the uncorrectable data set DSET_UE may mean a set of the uncorrectable data dt_UE respectively stored in the plurality of memory devices MEM00 to MEM15 and the plurality of ECC devices ECC00 and ECC01.

That is, in the case where the command signal stored in the command/address buffer 112 corresponds to the UE command CMD_UE (i.e., in the case where the command received from the memory controller 120 is the UE command CMD_UE), the command decoder 114 may control the uncorrectable data generator 117, and the uncorrectable data generator 117 may generate the uncorrectable data dt_UE under control of the command decoder 114.

The uncorrectable data dt_UE generated by the uncorrectable data generator 117 may be set to the sense amplifier and write driver 115 or may be set to the input/output circuit 116. In this case, the uncorrectable data dt_UE may be written in the memory cell array 111 regardless of a data signal received through the data lines DQx4.

In an embodiment, the UE command CMD_UE may be implemented through a combination of various commands (e.g., a write command, a pattern write command, a multi-purpose command, a reserved command, or a vendor command) or various signals (e.g., the control signals CTRL). A configuration of the UE command CMD_UE will be described in detail with reference to the following drawings.

In an embodiment, as in the above description, the remaining memory device (e.g., MEM00 and MEM02 to MEM15) and the ECC devices ECC00 and ECC01 may generate the uncorrectable data dt_UE in response to the UE command CMD_UE and may write the uncorrectable data dt_UE in the corresponding memory area. That is, each of the plurality of memory devices MEM00 to MEM15 and the plurality of ECC devices ECC00 and ECC01 may write the uncorrectable data dt_UE in the corresponding memory area in response to the UE command CMD_UE, and a set of the uncorrectable data dt_UE respectively read from the plurality of memory devices MEM00 to MEM15 and the plurality of ECC devices ECC00 and ECC01 may constitute the uncorrectable data set DSET_UE.

Figure 9:
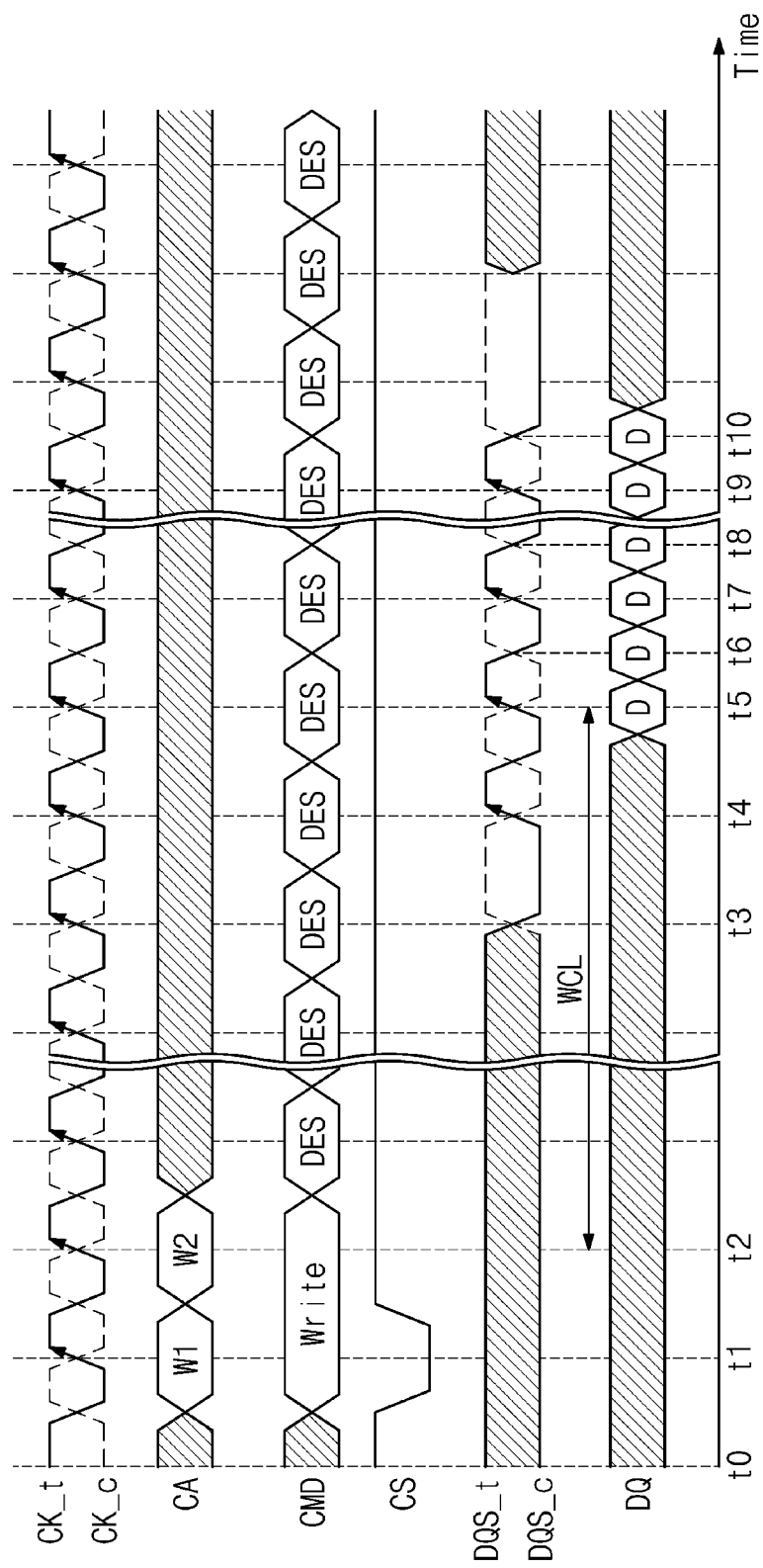
FIG. 9 is a timing diagram illustrating a write operation of a memory device.

FIG. 9 is a timing diagram illustrating a write operation of a memory device. Below, for convenience of description, a direct interface communication between the memory controller 120 and the first memory device MEM01 will be described, but the present disclosure is not limited thereto. For example, it may be understood that the interface communication between the memory controller 120 and the first memory device MEM01 may be applied to the configuration of the memory controller 120 and the memory module 110. For example, clock signals CK_t and CK_c, a signal through the command/address lines CA, and a chip select signal CS may be provided to the first memory device MEM01 through the register clock driver RCD.

Referring to FIGS. 1, 2, and 9, the memory controller 120 may send a write command Write to the first memory device MEM01. For example, the write command Write may include first and second write sub-commands W1 and W2. Through the command/address lines CA, the memory controller 120 may send the first write sub-command W1 to the first memory device MEM01 at a first point in time t1 and may send the second write sub-command W2 to the first memory device MEM01 at a second point in time t2. The memory controller 120 may maintain the chip select signal CS at a low level at the first point in time t1 and may maintain the chip select signal CS at a high level at the second point in time t2. The first and second write sub-commands W1 and W2 may include address information and an operation code associated with a write command.

At a fifth point in time t5 when a write latency WCL passes from the second point in time t2 when the write command Write is received, the memory controller 120 may send write data "D" to the first memory device MEM01 through the data lines DQ. In an embodiment, under control of the memory controller 120, data strobe signals DQS_t and DQS_c may toggle from a third point in time t3 being before a write preamble time from the fifth point in time t5. The write data "D" that are transferred from the memory controller 120 to the first memory device MEM01 may be center-aligned with rising edges and falling edges (e.g., fifth, sixth, seventh, eighth, ninth, and tenth points in time t5, t6, t7, t8, t9, and t10) of the data strobe signal DQS_t.

The first memory device MEM01 may store the write data "D" received through the data lines DQ in the memory cell array 111 in response to the write command Write received through the command/address lines CA.

Figure 10:
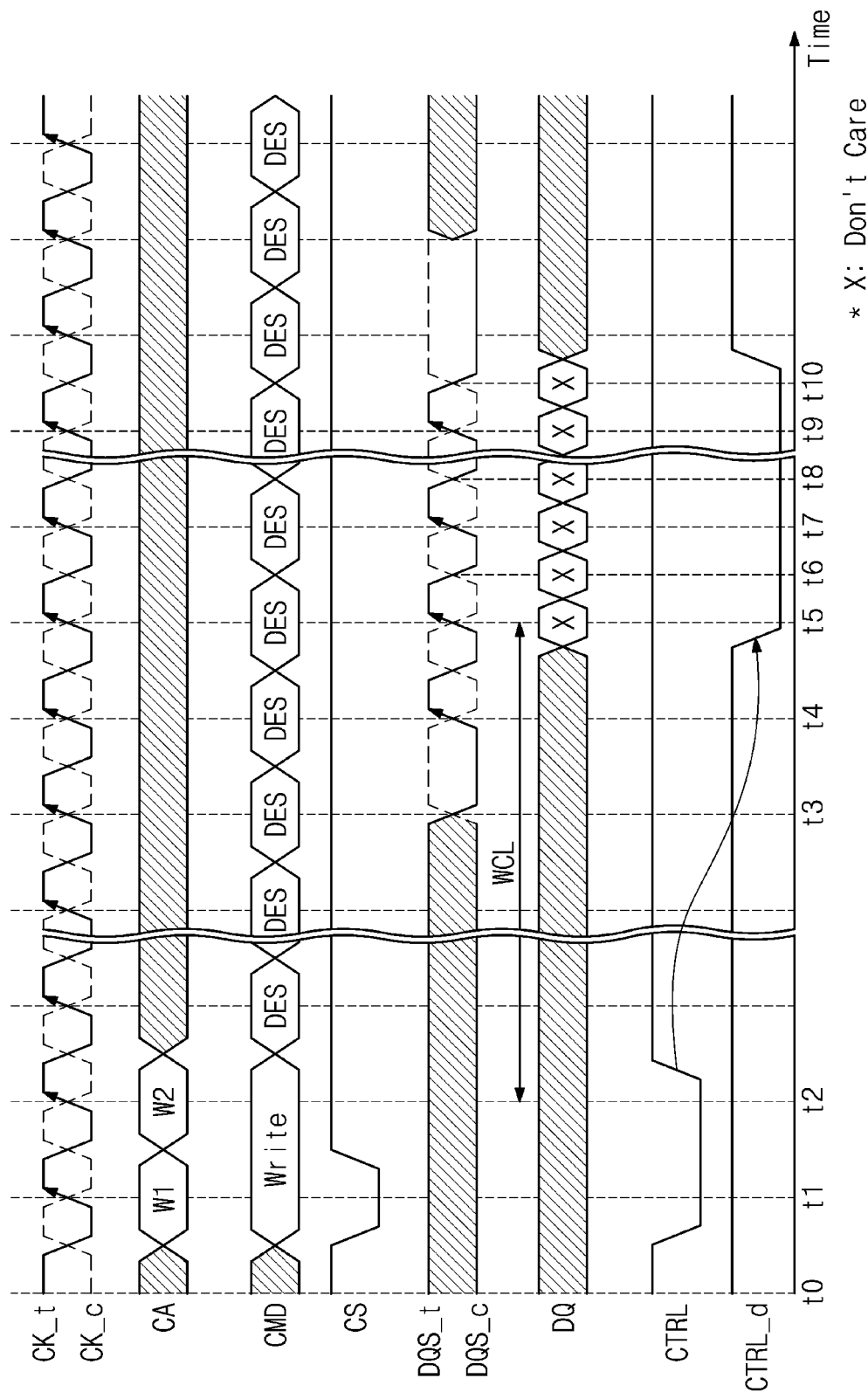
FIG. 10 is a timing diagram illustrating an operation of a first memory device of FIG. 8.
Figure 11:
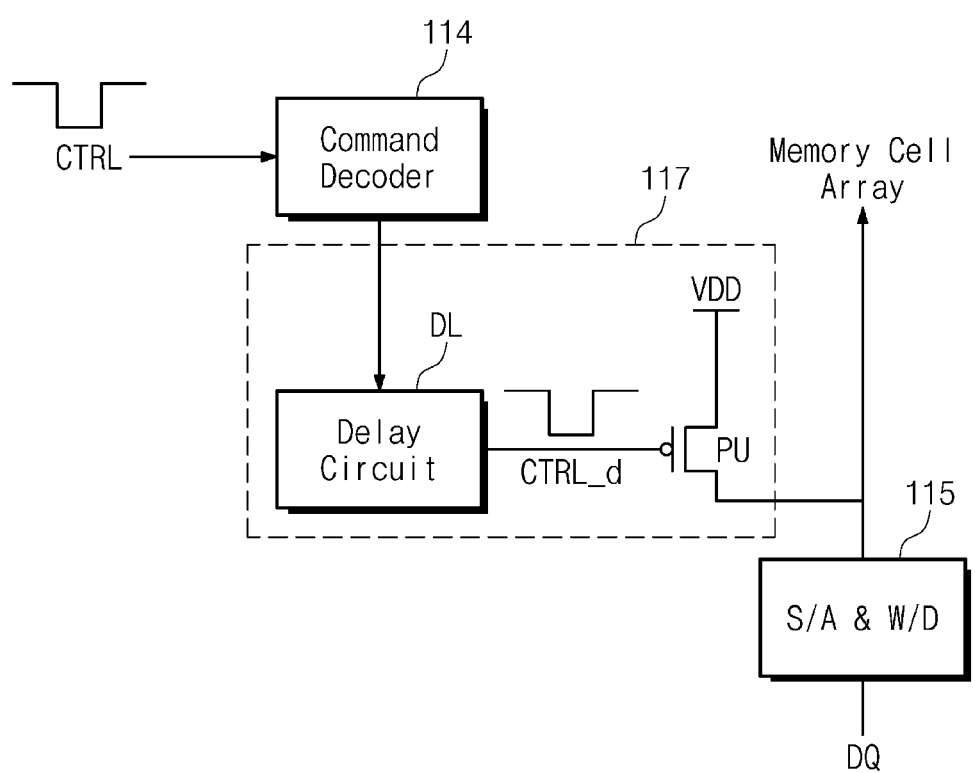
FIG. 11 is a diagram for describing an operation of a first memory device according to the timing diagram of FIG. 10.

FIG. 10 is a timing diagram illustrating an operation of a first memory device of FIG. 8. FIG. 11 is a diagram for describing an operation of a first memory device according to the timing diagram of FIG. 10. In an embodiment, an operation in which the first memory device MEM01 write the uncorrectable data dt_UE will be described with reference to FIGS. 10 and 11. In an embodiment, the remaining memory device MEM00 and MEM02 to MEM15 and the ECC devices ECC00 and ECC01 may write the uncorrectable data dt_UE based on the operation described with reference to FIGS. 10 and 11.

Referring to FIGS. 1, 8, 10, and 11, the memory controller 120 may send the write command Write to the first memory device MEM01. The write command Write may include the first and second write sub-commands W1 and W2. The write command Write and the first and second write sub-commands W1 and W2 are similar to those described with reference to FIG. 9, and thus, additional description will be omitted to avoid redundancy.

In an embodiment, the write command write illustrated in FIG. 10 may have the same signal configuration as the write command Write of FIG. 9. However, the memory controller 120 may maintain the control signal CTRL at the low level while the write command Write is transferred (i.e., during a time period from the first point in time t1 to the second point in time t2). In this case, as the control signal CTRL is maintained at the low level while the write command Write is transferred, the first memory device MEM01 may perform an operation different from an operation corresponding to the write command Write.

For example, in response to that the control signal CTRL is at the low level, the first memory device MEM01 may delay the control signal CTRL as much as a given time to generate a delayed control signal CTRL_d.

A delay time of the control signal CTRL may correspond to the write latency WCL. In response to the delayed control signal CTRL_d, the first memory device MEM01 may generate the uncorrectable data dt_UE regardless of a signal received through the data lines DQ and may write the uncorrectable data dt_UE in the memory cell array 111.

In detail, as illustrated in FIG. 11, the command decoder 114 may receive the control signal CTRL. The command decoder 114 may control the uncorrectable data generator 117 in response to that the control signal CTRL is at the low level while the write command Write is received.

The uncorrectable data generator 117 may include a delay circuit DL and a pull-up transistor PU. The delay circuit DL may generate the delayed control signal CTRL_d under control of the command decoder 114. In an embodiment, a delay time of the delayed control signal CTRL_d may correspond to the write latency WCL and may be maintained at the low level while data are received through the data line DQ. Alternatively, the delayed control signal CTRL_d may maintain the low level while the data strobe signals DQS_t and DQS_c toggle, while a signal is received through the data lines DQ, or during a period corresponding to a burst length.

The pull-up transistor PU may be connected between the sense amplifier and write driver 115 and a power supply voltage VDD and may operate in response to the delayed control signal CTRL_d. For example, when the delayed control signal CTRL_d is at the low level, the pull-up transistor PU may be turned on, and thus, signals that are provided to the memory cell array 111 may be maintained at the high level regardless of the output of sense amplifier and write driver 115. In this case, the same bit value (e.g., a bit value of "1") may be written in the memory cell array 111 regardless of a signal received through the data lines DQ.

In other words, as illustrated in FIGS. 10 and 11, the memory controller 120 may implement the UE command CMD_UE by using the write command Write and the control signal CTRL. In response to the UE command CMD_UE based on the write command Write and the control signal CTRL, the first memory device MEM01 may write the uncorrectable data dt_UE in the memory cell array 111 regardless of a signal received through the data lines DQ.

In the embodiment of FIG. 11, the uncorrectable data generator 117 is illustrated as controlling a signal between the sense amplifier and write driver 115 and the memory cell array 111, but the present disclosure is not limited thereto. For example, the uncorrectable data generator 117 may be configured to directly set the sense amplifier and write driver 115. That is, the uncorrectable data dt_UE may be directly set to the sense amplifier and write driver 115 by the operation of the uncorrectable data generator 117. Alternatively, the pull-up transistor PU of the uncorrectable data generator 117 may be directly connected with the data lines DQ or may be configured to control a data line driver configured to control the data lines DQ.

In an embodiment, in the case where the memory controller 120 sends the UE command CMD_UE based on the write command Write and the control signal CTRL, the memory controller 120 may not provide a separate signal through the data lines DQ after the write latency WCL or may provide arbitrary signals through the data lines DQ after the write latency WCL.

In an embodiment, the control signal CTRL described above may be one of various signals defined by the interface standard between the memory module 110 and the memory controller 120. For example, the control signal CTRL may be an alert signal Alert_n between the memory module 110 and the memory controller 120. In an embodiment, in the event where an error (e.g., a CRC error) occurs in data signals input to the memory module 110, the alert signal Alert_n may be a signal for informing the event of the memory controller 120. In an embodiment of the present disclosure, the alert signal Alert_n may be not only provided from the memory module 110 to the memory controller 120, but may be also transferred from the memory controller 120 to the memory module 110. As such, uncorrectable data may be written in memory devices. Alternatively, the control signal CTRL may be one of various signals that are capable of being controlled or driven by the memory controller 120.

Figure 12:
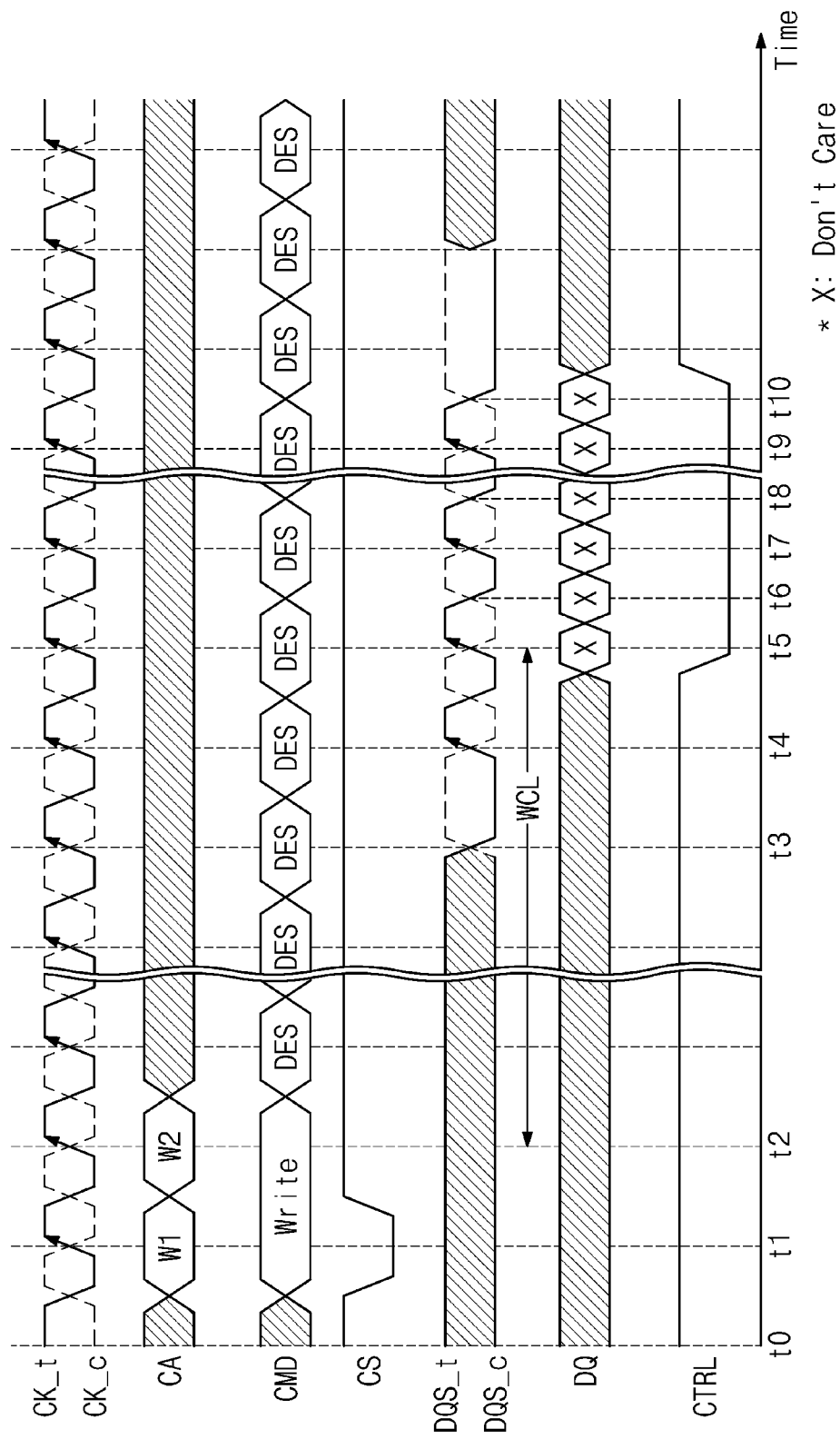
FIG. 12 is a timing diagram illustrating an operation of a first memory device of FIG. 8.

FIG. 12 is a timing diagram illustrating an operation of a first memory device of FIG. 8. Referring to FIGS. 1, 8, and 12, the memory controller 120 may send the write command Write to the first memory device MEM01. The write command Write may include the first and second write sub-commands W1 and W2. The write command Write and the first and second write sub-commands W1 and W2 are similar to those described with reference to FIG. 9, and thus, additional description will be omitted to avoid redundancy.

After the write latency WCL passes from a point in time (e.g., the second point in time t2) when the write command Write is transferred, the memory controller 120 may send the data strobe signals DQS_t and DQS_c and the data signal DQ to the first memory device MEM01. While the memory controller 120 sends the data strobe signals DQS_t and DQS_c and the data signal DQ (e.g., during a time period from the fifth point in time t5 to the tenth point in time t10), the memory controller 120 may maintain the control signal CTRL at the low level. In response to the control signal CTRL of the low level, the first memory device MEM01 may write the uncorrectable data dt_UE in the memory cell array 111 regardless of signals received through the data lines DQ.

That is, by using the control signal CTRL, the memory controller 120 may select or control whether data transferred through the data lines DQ are written to the first memory device MEM01 or whether the uncorrectable data dt_UE are written to the first memory device MEM01.

As described above, according to an embodiment of the present disclosure, in the case where the uncorrectable error UE is included in the data set DSET read from the memory module 110, the memory controller 120 may write the uncorrectable data set DSET_UE in the memory module 110 by using the UE command CMD_UE. In this case, the UE command CMD_UE may be implemented through various combinations of commands or control signals defined according to the interface standard between the memory module 110 and the memory controller 120.

Figure 13:
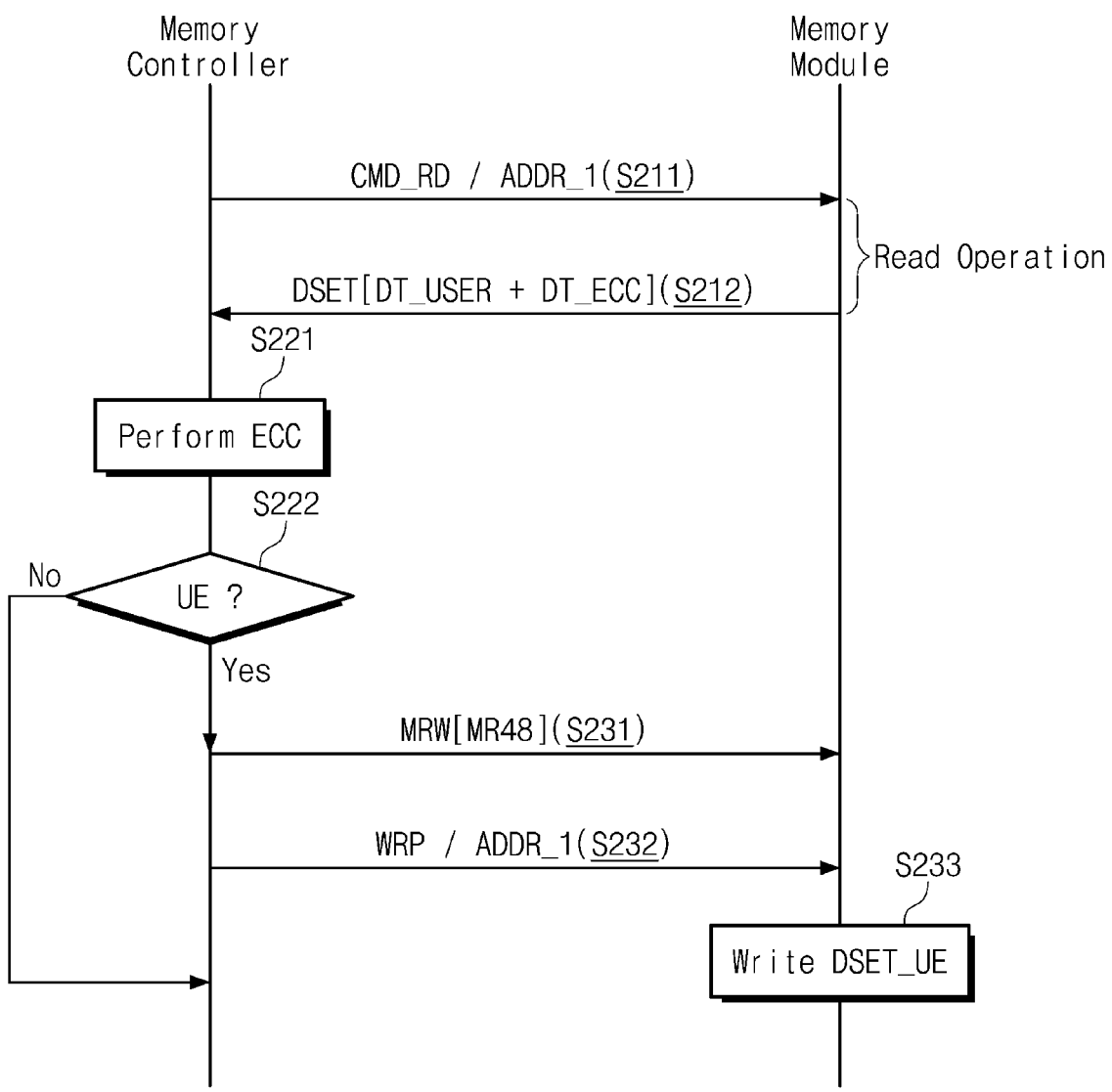
FIG. 13 is a flowchart illustrating an operation of a memory system of FIG. 1.
Figure 14:
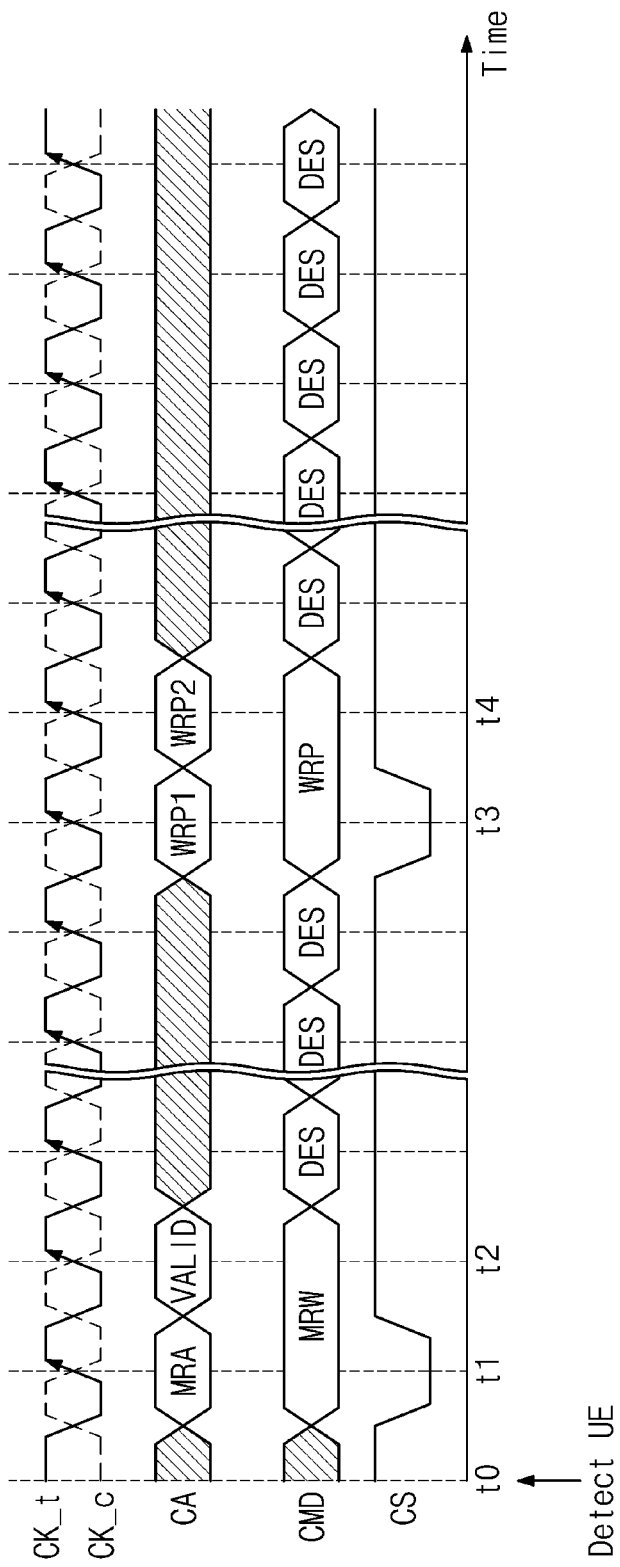
FIG. 14 is a timing diagram illustrating operation S231 and operation S232 of FIG. 13.

FIG. 13 is a flowchart illustrating an operation of the memory system of FIG. 1. FIG. 14 is a timing diagram illustrating operation S231 and operation S232 of FIG. 13. Referring to FIGS. 1, 13, and 14, the memory module 110 and the memory controller 120 may perform operation S211, operation S212, operation S221, and operation S222. Operation S211, operation S212, operation S221, and operation S222 are similar to operation S111, operation S112, operation S121, and operation S122 of FIG. 5, and thus, additional description will be omitted to avoid redundancy.

In operation S231, the memory controller 120 may send a mode register write command MRW to the memory module 110. A specific mode register included in the plurality of memory devices MEM00 to MEM15 and the plurality of ECC devices ECC00 and ECC01 of the memory module 110 may be set in response to the mode register write command MRW.

For example, as illustrated in FIG. 14, in the case where the uncorrectable error UE is detected at or before a 0-th point in time to, the memory controller 120 may send the mode register write command MRW to the memory module 110. The memory controller 120 may send the mode register write command MRW to the memory module 110 by sending the mode register address MRA at a first point in time t1 with the chip select signal CS maintained at the low level and sending valid information VALID (e.g., an operation code (OPCode)) at a second point in time t2 with the chip select signal CS maintained at the high level.

In operation S232, the memory controller 120 may send a write pattern command WRP and a first address ADDR_1 to the memory module 110. For example, as illustrated in FIG. 14, the memory controller 120 may send the write pattern command WRP to the memory module 110. The write pattern command WRP may include first and second write pattern sub-commands WRP1 and WRP2. The memory controller 120 may send the write pattern command WRP to the memory module 110 by sending the first write pattern sub-command WRP1 at a third point in time t3 with the chip select signal CS maintained at the low level and sending the second write pattern sub-command WRP2 at a fourth point in time t4 with the chip select signal CS maintained at the high level.

In operation S233, the memory module 110 may write the uncorrectable data set DSET_UE in response to the write pattern command WRP.

In an embodiment, the specific mode register that is set through the mode register write command MRW may be a mode register of MR48. According to the DDR5 standard, the mode register of MR48 may store information about a write pattern mode. For example, the mode register of MR48 may include 0-th to seventh opcodes OP[0] to OP[7]. The 0-th to seventh opcodes OP[0] to OP[7] may indicate bit values corresponding to a plurality of data lines DQ. That is, in the case where each of the 0-th to seventh opcodes OP[0] to OP[7] is set to a bit value of "1", the plurality of memory devices MEM00 to MEM15 and the plurality of ECC devices ECC00 and ECC01 of the memory module 110 may set and write all signals corresponding to the data lines DQ to "1".

As described above, in the case where the data set DSET read from the memory module 110 includes the uncorrectable error UE, the memory controller 120 may write the uncorrectable data set DSET_UE in the memory module 110 by using the write pattern command WRP and the mode register of MR48 defined by the DDR5 standard.

Figure 15:
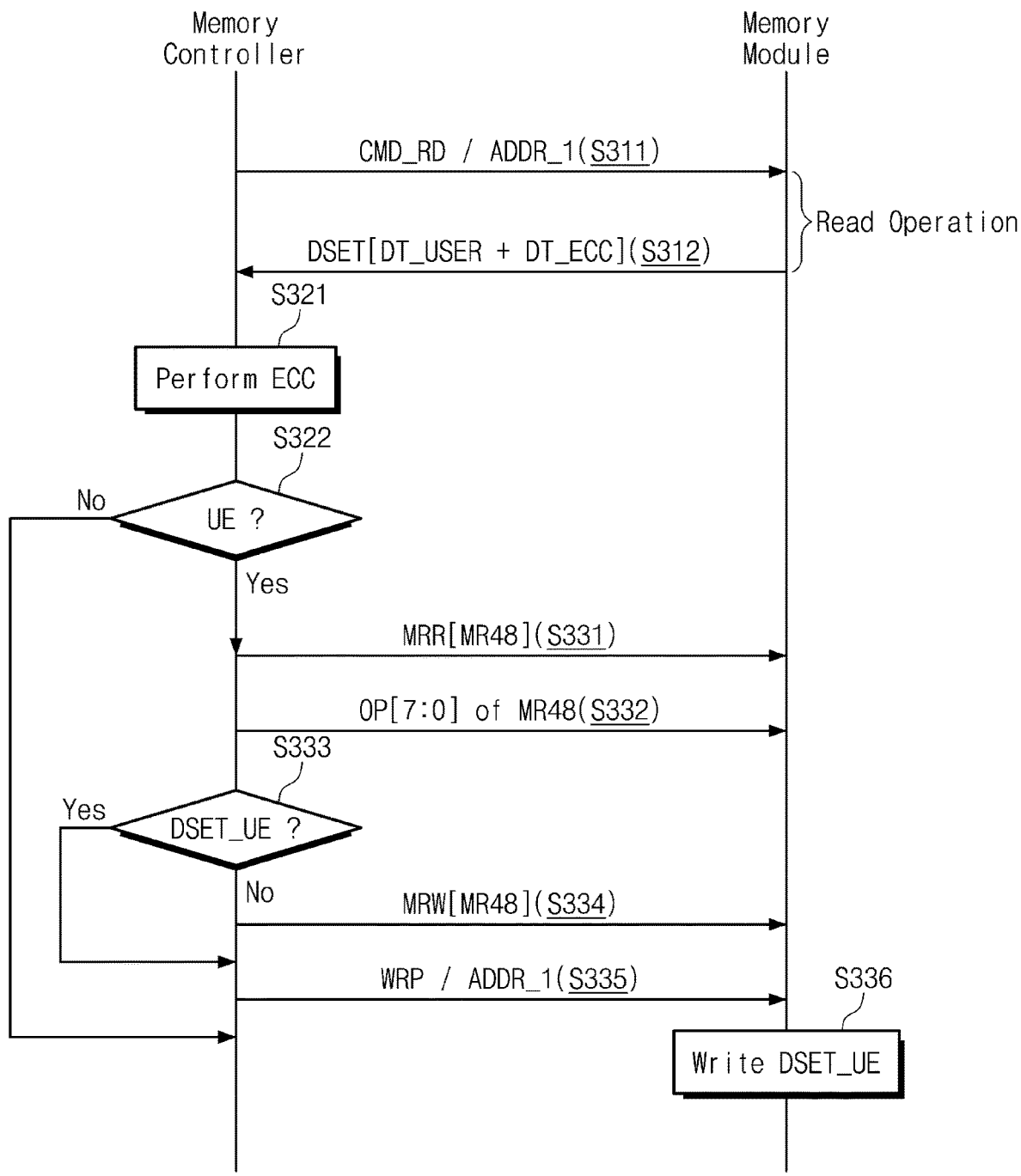
FIG. 15 is a flowchart illustrating an operation of a memory system of FIG. 1.

FIG. 15 is a flowchart illustrating an operation of a memory system of FIG. 1. Referring to FIGS. 1 and 15, the memory module 110 and the memory controller 120 may perform operation S311, operation S312, operation S321, and operation S322. Operation S311, operation S312, operation S321, and operation S322 are similar to operation S111, operation S112, operation S121, and operation S122 of FIG. 5, and thus, additional description will be omitted to avoid redundancy.

When the data set DSET includes the uncorrectable error UE, in operation S331, the memory controller 120 may send a mode register read command MRR to the memory module 110. In operation S332, the memory module 110 may send information of a specific mode register to the memory controller 120 in response to the mode register read command MRR.

In an embodiment, the mode register read command MRR may be a command for reading information about the mode register of MR48. The information of the specific mode register may include opcodes OP[7:0] of the mode register of MR48.

In operation S333, the memory controller 120 may determine whether the opcodes OP[7:0] of the mode register of MR48 correspond to the uncorrectable data set DSET_UE. For example, in the case where the uncorrectable data set DSET_UE corresponds to all one bit stream, the memory controller 120 may determine whether each of the opcodes OP[7:0] of the mode register of MR48 is set to a bit value of "1".

When the opcodes OP[7:0] of the mode register of MR48 do not correspond to the uncorrectable data set DSET_UE, in operation S334, the memory controller 120 may send the mode register write command MRW for the mode register of MR48 to the memory module 110. In operation S335, the memory controller 120 may send the write pattern command WRP and the first address ADDR_1 to the memory module 110. In operation S336, the memory module 110 may write the uncorrectable data set DSET_UE in response to the write pattern command WRP. Operation S334 to operation S336 are similar to operation S231 to operation S233 of FIG. 13, and thus, additional description will be omitted to avoid redundancy.

When the opcodes OP[7:0] of the mode register of MR48 correspond to the uncorrectable data set DSET_UE, the memory controller 120 and the memory module 110 may omit setting the mode register of MR48 (i.e., operation S334) and may perform operation S335 and operation S336.

Figure 16:
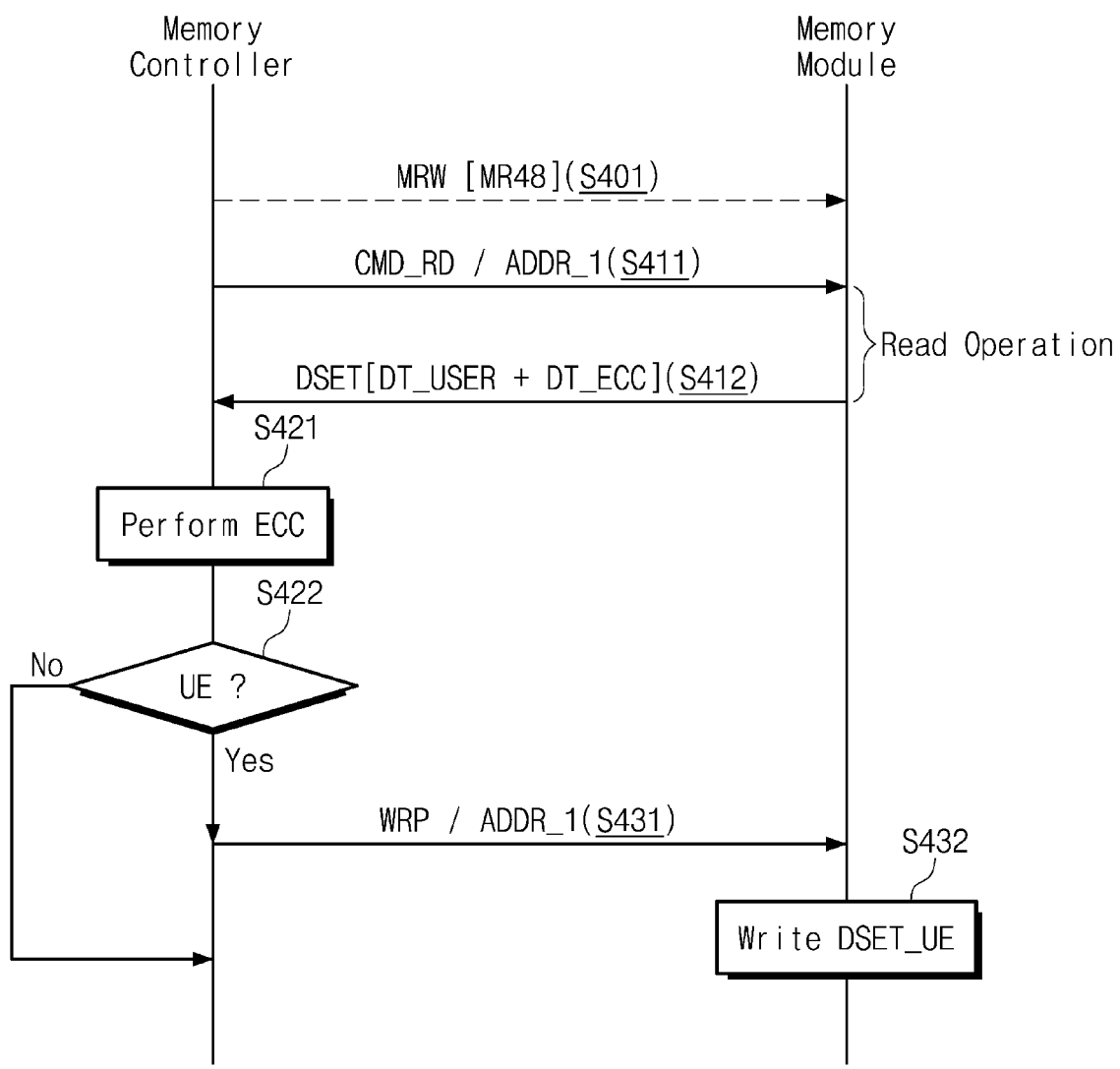
FIG. 16 is a flowchart illustrating an operation of a memory system of FIG. 1.

FIG. 16 is a flowchart illustrating an operation of a memory system of FIG. 1. Referring to FIGS. 1 and 16, the memory module 110 and the memory controller 120 may perform operation S401, operation S411, operation S412, operation S421, operation S422, operation S431, and operation S432. Operation S411, operation S412, operation S421, operation S422, operation S431, and operation S432 are similar to operation S211, operation S212, operation S221, operation S222, operation S231, and operation S232 of FIG. 13, and thus, additional description will be omitted to avoid redundancy.

Unlike the embodiment of FIG. 13, in the embodiment of FIG. 16, the memory controller 120 may in advance set the mode register of MR48. For example, in operation S401, to set the mode register of MR48, the memory controller 120 may send the mode register write command MRW to the memory module 110. That is, the memory controller 120 may set the opcodes of MR48 by using the mode register write command MRW so as to correspond to the uncorrectable data set DSET_UE. In an embodiment, operation S401 may be performed at an initialization operation between the memory module 110 and the memory controller 120 or may be performed at various operation points in time.

As described above, according to an embodiment of the present disclosure, in the case where the uncorrectable error UE is included in the data set DSET read from the memory module 110, the memory controller 120 may write the uncorrectable data set DSET_UE in the memory module 110 by using the UE command CMD_UE that is based on a combination of various commands and control signals. Accordingly, a data set or a memory area in which the uncorrectable error UE is included may be marked without the decrease in the capacity of the user data DT_USER and the reduction of the error correction capability of the ECC engine 121.

In the above embodiments, various commands or control signals for writing the uncorrectable data set DSET_UE in the memory module 110, or a combination thereof is described, but the present disclosure is not limited thereto. For example, the memory controller 120 may write the uncorrectable data set DSET_UE in the memory module 110 by using the multi-purpose command (MPC) or various other commands.

Figure 17:
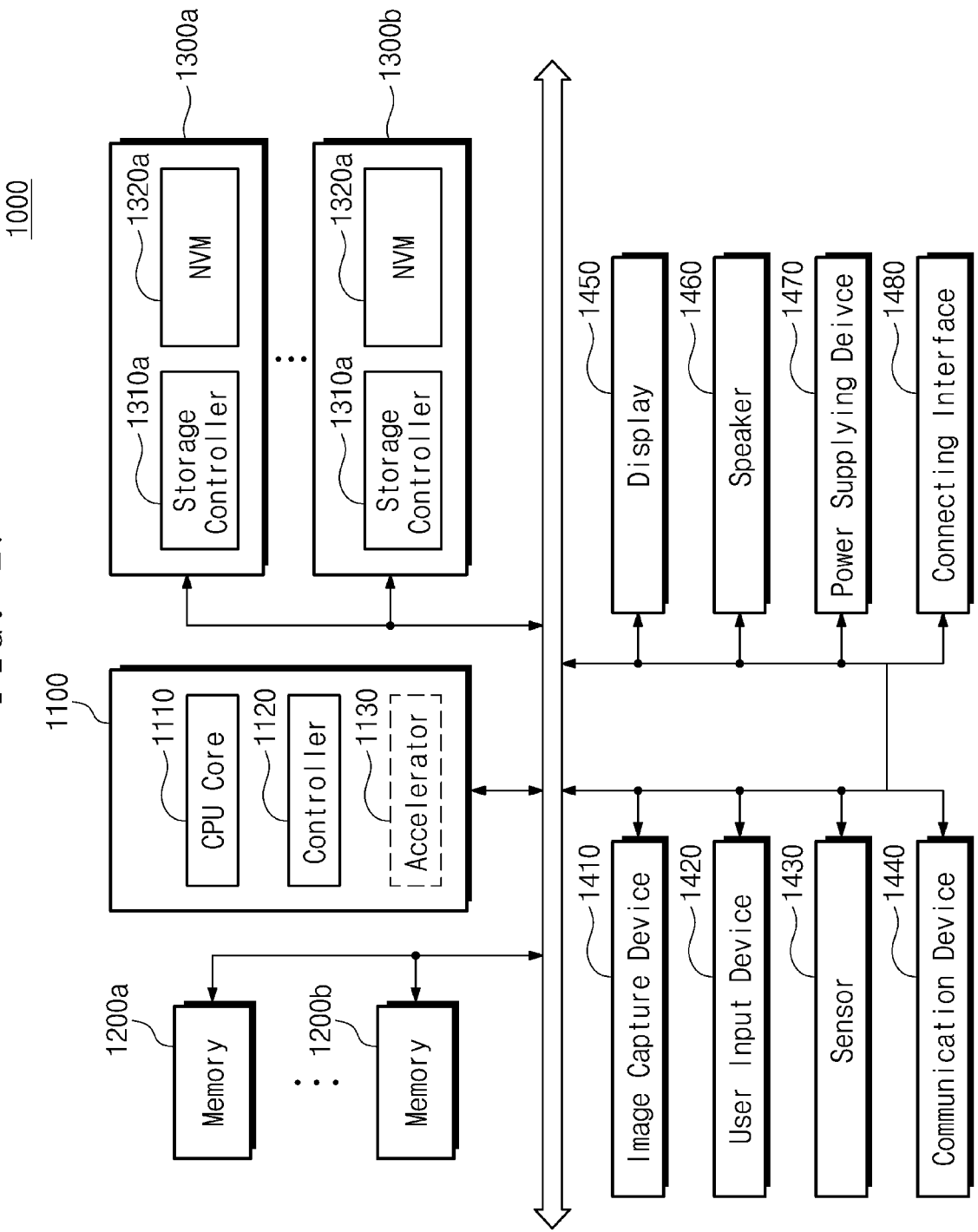
FIG. 17 is a diagram illustrating a computer system to which a memory system according to an embodiment of the present disclosure is applied.

FIG. 17 is a diagram of a system 1000 to which a storage device is applied, according to an embodiment. The system 1000 of FIG. 17 may basically be a mobile system, such as a portable communication terminal (e.g., a mobile phone), a smartphone, a tablet personal computer (PC), a wearable device, a healthcare device, or an Internet of things (IoT) device. However, the system 1000 of FIG. 17 is not necessarily limited to the mobile system and may be a PC, a laptop computer, a server, a media player, or an automotive device (e.g., a navigation device).

Referring to FIG. 17, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

In an embodiment, the memory module 110 described with reference to FIGS. 1 to 16 may correspond to each of the memories 1200a and 1200b of FIG. 17, and the memory controller 120 described with reference to FIGS. 1 to 16 may be the main processor 1100 of FIG. 17 or may be included in the main processor 1100. The main processor 1100 and the memories 1200a and 1200b of FIG. 17 may operate based on the operation methods described with reference to FIGS. 1 to 16.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and NVM (Non-Volatile Memory) s 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 100 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 18:
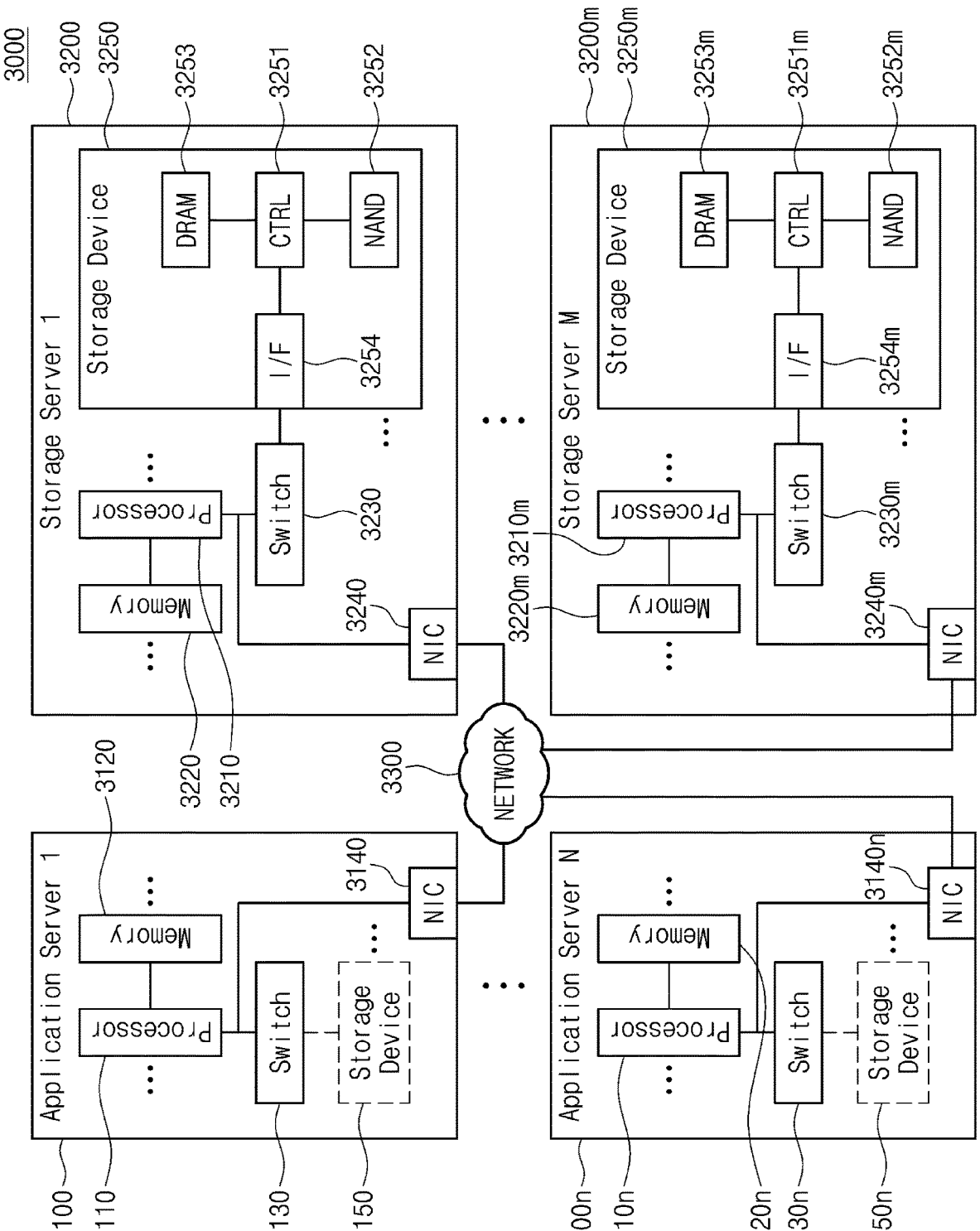
FIG. 18 is a block diagram illustrating a data center to which a memory system according to an embodiment of the present disclosure is applied.

FIG. 18 is a diagram of a data center 3000 to which a memory device is applied, according to an embodiment.

Referring to FIG. 18, the data center 3000 may be a facility that collects various types of pieces of data and provides services and be referred to as a data storage center. The data center 3000 may be a system for operating a search engine and a database, and may be a computing system used by companies, such as banks, or government agencies. The data center 3000 may include application servers 3100 to 3100n ("Application Server 1" to "Application Server N") and storage servers 3200 to 3200m ("Storage Server 1" to "Storage Server M"). The number of application servers 3100 to 3100n and the number of storage servers 3200 to 3200m may be variously selected according to embodiments. The number of application servers 3100 to 3100n may be different from the number of storage servers 3200 to 3200m.

The application server 3100 or the storage server 3200 may include at least one of processors 3110 and 3210, switch 3130, storage device 3150, NIC 3140 and memories 3120 and 3220. The storage server 3200 will now be described as an example. The processor 3210 may control all operations of the storage server 3200, access the memory 3220, and execute instructions and/or data loaded in the memory 3220. The memory 3220 may be a double-data-rate synchronous DRAM (DDR SDRAM), a high-bandwidth memory (HBM), a hybrid memory cube (HMC), a dual in-line memory module (DIMM), Optane DIMM, and/or a non-volatile DIMM (NVMDIMM). In some embodiments, the numbers of processors 3210 and memories 3220 included in the storage server 3200 may be variously selected. In an embodiment, the processor 3210 and the memory 3220 may provide a processor-memory pair. In an embodiment, the number of processors 3210 may be different from the number of memories 3220. The processor 3210 may include a single-core processor or a multi-core processor. The above description of the storage server 3200 may be similarly applied to the application server 3100. In some embodiments, the application server 3100 may not include the storage device 3150. The storage server 3200 may include at least one storage device 3250. The number of storage devices 3250 included in the storage server 3200 may be variously selected according to embodiments.

The application servers 3100 to 3100n may communicate with the storage servers 3200 to 3200m through a network 3300. The network 3300 may be implemented by using a fiber channel (FC) or Ethernet. In this case, the FC may be a medium used for relatively high-speed data transmission and use an optical switch with high performance and high availability. The storage servers 3200 to 3200m may be provided as file storages, block storages, or object storages according to an access method of the network 3300.

In an embodiment, the network 3300 may be a storage-dedicated network, such as a storage area network (SAN). For example, the SAN may be an FC-SAN, which uses an FC network and is implemented according to an FC protocol (FCP). As another example, the SAN may be an Internet protocol (IP)-SAN, which uses a transmission control protocol (TCP)/IP network and is implemented according to a SCSI over TCP/IP or Internet SCSI (iSCSI) protocol. In another embodiment, the network 3300 may be a general network, such as a TCP/IP network. For example, the network 3300 may be implemented according to a protocol, such as FC over Ethernet (FCOE), network attached storage (NAS), and NVMe over Fabrics (NVMe-oF).

Hereinafter, the application server 3100 and the storage server 3200 will mainly be described. A description of the application server 3100 may be applied to another application server 3100n, and a description of the storage server 3200 may be applied to another storage server 3200m.

The application server 3100 may store data, which is requested by a user or a client to be stored, in one of the storage servers 3200 to 3200m through the network 3300. Also, the application server 3100 may obtain data, which is requested by the user or the client to be read, from one of the storage servers 3200 to 3200m through the network 3300. For example, the application server 3100 may be implemented as a web server or a database management system (DBMS).

The application server 3100 may access a memory 3120n or a storage device 3150n, which is included in another application server 3100n, through the network 3300. Alternatively, the application server 3100 may access memories 3220 to 3220m or storage devices 3250 to 3250m, which are included in the storage servers 3200 to 3200m, through the network 3300. Thus, the application server 3100 may perform various operations on data stored in application servers 3100 to 3100n and/or the storage servers 3200 to 3200m. For example, the application server 3100 may execute an instruction for moving or copying data between the application servers 3100 to 3100n and/or the storage servers 3200 to 3200m. In this case, the data may be moved from the storage devices 3250 to 3250m of the storage servers 3200 to 3200m to the memories 3120 to 3120n of the application servers 3100 to 3100n directly or through the memories 3220 to 3220m of the storage servers 3200 to 3200m. The data moved through the network 3300 may be data encrypted for security or privacy.

The storage server 3200 will now be described as an example. An interface 3254 may provide physical connection between a processor 3210 and a controller 3251 and a physical connection between a network interface card (NIC) 3240 and the controller 3251. For example, the interface 3254 may be implemented using a direct attached storage (DAS) scheme in which the storage device 3250 is directly connected with a dedicated cable. For example, the interface 3254 may be implemented by using various interface schemes, such as ATA, SATA, e-SATA, an SCSI, SAS, PCI, PCIe, NVMe, IEEE 1394, a USB interface, an SD card interface, an MMC interface, an eMMC interface, a UFS interface, an eUFS interface, and/or a CF card interface.

The storage server 3200 may further include a switch 3230 and the NIC (Network InterConnect) 3240. The switch 3230 may selectively connect the processor 3210 to the storage device 3250 or selectively connect the NIC 3240 to the storage device 3250 via the control of the processor 3210.

In an embodiment, the NIC 3240 may include a network interface card and a network adaptor. The NIC 3240 may be connected to the network 3300 by a wired interface, a wireless interface, a Bluetooth interface, or an optical interface. The NIC 3240 may include an internal memory, a digital signal processor (DSP), and a host bus interface and be connected to the processor 3210 and/or the switch 3230 through the host bus interface. The host bus interface may be implemented as one of the above-described examples of the interface 3254. In an embodiment, the NIC 3240 may be integrated with at least one of the processor 3210, the switch 3230, and the storage device 3250.

In the storage servers 3200 to 3200m or the application servers 3100 to 3100n, a processor may transmit a command to storage devices 3150 to 3150n and 3250 to 3250m or the memories 3120 to 3120n and 3220 to 3220m and program or read data. In this case, the data may be data of which an error is corrected by an ECC engine. The data may be data on which a data bus inversion (DBI) operation or a data masking (DM) operation is performed, and may include cyclic redundancy code (CRC) information. The data may be data encrypted for security or privacy.

Storage devices 3150 to 3150n and 3250 to 3250m may transmit a control signal and a command/address signal to NAND flash memory devices 3252 to 3252m in response to a read command received from the processor. Thus, when data is read from the NAND flash memory devices 3252 to 3252m, a read enable (RE) signal may be input as a data output control signal, and thus, the data may be output to a DQ bus. A data strobe signal DQS may be generated using the RE signal. The command and the address signal may be latched in a page buffer depending on a rising edge or falling edge of a write enable (WE) signal.

The controller 3251 may control all operations of the storage device 3250. In an embodiment, the controller 3251 may include SRAM. The controller 3251 may write data to the NAND flash memory device 3252 in response to a write command or read data from the NAND flash memory device 3252 in response to a read command. For example, the write command and/or the read command may be provided from the processor 3210 of the storage server 3200, the processor 3210m of another storage server 3200m, or the processors 3110 and 3110n of the application servers 3100 and 3100n. DRAM 3253 may temporarily store (or buffer) data to be written to the NAND flash memory device 3252 or data read from the NAND flash memory device 3252. Also, the DRAM 3253 may store metadata. Here, the metadata may be user data or data generated by the controller 3251 to manage the NAND flash memory device 3252. The storage device 3250 may include a secure element (SE) for security or privacy.

In an embodiment, each of the processors 3110 to 3100n and 3210 to 3210m included in the application servers 3100 to 3100n and the storage servers 3200 to 3200m illustrated in FIG. 18 may include the memory controller 120 described with reference to FIGS. 1 to 16, and each of the memories 3120 to 3120n and 3220 to 3220m included in the application servers 3100 to 3100n and the storage servers 3200 to 3200m illustrated in FIG. 18 may be the memory module 110 described with reference to FIGS. 1 to 16. Each of the processors 3110 to 3100n and 3210 to 3210m and each of the memories 3120 to 3120n and 3220 to 3220m may operate based on the operation method described with reference to FIGS. 1 to 16.

According to an embodiment of the present disclosure, in the case where a data set read from a memory module includes an uncorrectable error, a memory controller writes a data set of a specific pattern in the memory module. In this case, because there is no need to allocate a separate bit for providing notification that the uncorrectable error is included in the data set, the reduction of the error correction capability of the memory controller and the decrease in the capacity of user data are prevented. Accordingly, an operation method of a memory controller with improved reliability, an operation method of a memory module, and an operation method of a memory system are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method of a memory controller which is configured to control a memory module including a plurality of memory devices and at least one error correction code (ECC) device, the method comprising:
    reading a data set including user data stored in the plurality of memory devices and ECC data stored in the at least one ECC device, based on a read command and a first address; and
    writing uncorrectable data in a memory area, which is included in each of the plurality of memory devices and the at least one ECC device and corresponds to the first address, based on an error of the user data not being corrected based on the ECC data,
    wherein the writing of the uncorrectable data comprises sending a signal to the memory module indicating the uncorrectable data, and
    wherein the signal is an operation code on a command/address bus or the signal is a control voltage provided by the memory controller.

2. The method of claim 1, wherein the writing of the uncorrectable data further comprises sending a write command to the memory module and maintaining an alert signal at a low level while the write command is transferred, wherein the control voltage is the alert signal.

3. The method of claim 1, wherein the writing of the uncorrectable data further comprises:
    sending a write command to the memory module; and
    maintaining an alert signal at a low level after a write latency passes from a point in time when the write command is transferred, wherein the control voltage is the alert signal.

4. The method of claim 1, wherein the writing of the uncorrectable data further comprises:
    sending a mode register write command to the memory module; and
    sending a write pattern command to the memory module, wherein the operation code is the write pattern command.

5. The method of claim 4, wherein a mode register of each of the plurality of memory devices and the at least one ECC device is set in response to the mode register write command.

6. The method of claim 4, wherein the writing of the uncorrectable data further comprises:
    sending a mode register read command to the memory module before sending the mode register write command to the memory module; and
    receiving mode register information from the memory module,
    wherein, based on the mode register information not corresponding to the uncorrectable data, the mode register write command is provided to the memory module.

7. The method of claim 1, wherein the read command is a command for a read operation included in a read-modify-write operation.

8. The method of claim 1, wherein the writing of the uncorrectable data is performed without sending the uncorrectable data to the memory module.

9. The method of claim 1, wherein an uncorrectable data set including the uncorrectable data of each of the plurality of memory devices and the at least one ECC device includes an error uncorrectable by an error correction operation of the memory controller.

10. The method of claim 1, wherein all bit values of the uncorrectable data are "1".

11. A method of a memory module which includes a plurality of memory devices and at least one error correction code (ECC) device, the method comprising:
    receiving a read command and a first address from a memory controller;
    sending a data set including user data stored in the plurality of memory devices and ECC data stored in the at least one ECC device to the memory controller, based on the read command and the first address; and
    based on an error of the user data not being corrected by the memory controller based on the ECC data, writing uncorrectable data in each of the plurality of memory devices and the at least one ECC device under control of the memory controller,
    wherein the writing of the uncorrectable data comprises sending a signal to the memory module indicating the uncorrectable data, and
    wherein the signal is an operation code on a command/address bus or the signal is a control voltage provided by the memory controller sending a write pattern command to the memory module.

12. The method of claim 11, wherein the writing of the uncorrectable data further comprises:
    receiving a write command an alert signal from the memory controller;
    generating the uncorrectable data in response to the write command and the alert signal, by each of the plurality of memory devices and the at least one ECC device, wherein the control voltage is the alert signal; and
    writing the uncorrectable data, by each of the plurality of memory devices and the at least one ECC device.

13. The method of claim 11, wherein the writing of the uncorrectable data further comprises:
    receiving a write pattern command from the memory controller, wherein the operation code is the write pattern command; and
    writing the uncorrectable data based on opcodes of a mode register of each of the plurality of memory devices and the at least one ECC device in response to the write pattern command, by each of the plurality of memory devices and the at least one ECC device.

14. The method of claim 13, further comprising:
    before writing the uncorrectable data:
    receiving a mode register write command from the memory controller; and
    setting the opcodes of the mode register of each of the plurality of memory devices and the at least one ECC device with values corresponding to the uncorrectable data in response to the mode register write command, by each of the plurality of memory devices and the at least one ECC device, wherein the operation code comprises the opcodes.

15. The method of claim 11, wherein all bit values of the uncorrectable data are "1".

16. The method of claim 11, wherein the uncorrectable data are not received from the memory controller through data lines.

17. A method of a memory system which includes a memory controller and a memory module including a plurality of memory devices and at least one error correction code (ECC) device, the method comprising:
- reading, by the memory controller, a data set from the memory module;
- correcting, by the memory controller, an error of the data set;
- sending, by the memory controller, an uncorrectable command to the memory module, based on the error of the data set not being corrected; and
- writing, by the memory module, uncorrectable data in each of the plurality of memory devices and the at least one ECC device, in response to the uncorrectable command,
- wherein an uncorrectable data set including the uncorrectable data stored in each of the plurality of memory devices and the at least one ECC device includes an error uncorrectable by an error correction operation of the memory controller,
- wherein the writing of the uncorrectable data comprises sending to the memory module a signal indicating the uncorrectable data, and
- wherein the signal is an operation code on a command/address bus or the signal is a control voltage provided by the memory controller.

18. The method of claim 17, wherein the uncorrectable command includes a write command and an alert signal (Alert_n), wherein the control voltage is the alert signal, and
- wherein the writing of the uncorrectable data by the memory module comprises writing the uncorrectable data in response to the write command and the alert signal, regardless of signals received through data lines after a write latency from a point in time when the write command is received.

19. The method of claim 17, wherein the uncorrectable command includes a write command,
- the method further comprising sending, by the memory controller, an alert signal to the memory module after a write latency passes from a point in time when the uncorrectable command is sent, wherein the control voltage is the alert signal.

20. The method of claim 17, wherein the writing of the uncorrectable data is performed without a transfer of a data signal from the memory controller to the memory module through the data lines.

* * * * *